(12) United States Patent
Hurwitz et al.

(10) Patent No.: US 9,374,059 B1
(45) Date of Patent: Jun. 21, 2016

(54) FILM BULK ACOUSTIC RESONATOR FILTER

(71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 1 day.

(21) Appl. No.: 14/590,621

(22) Filed: Jan. 6, 2015

(51) Int. Cl.
  *H03H 9/10* (2006.01)
  *H03H 9/17* (2006.01)
  *H03H 9/54* (2006.01)
  *H01L 41/053* (2006.01)

(52) U.S. Cl.
  CPC  *H03H 9/171* (2013.01); *H03H 9/54* (2013.01)

(58) Field of Classification Search
  CPC ... H03H 9/1007; H03H 9/1035; H01L 41/053
  USPC .......... 333/133, 187, 189, 191; 310/320, 324, 310/348
  See application file for complete search history.

(56) References Cited

U.S. PATENT DOCUMENTS

| | | | | |
|---|---|---|---|---|
| 5,430,345 A | * | 7/1995 | Takahashi | H03H 9/177 310/344 |
| 7,248,131 B2 | * | 7/2007 | Fazzio | B81C 1/00246 257/416 |
| 7,498,900 B2 | * | 3/2009 | Lee | H01L 27/0805 333/133 |
| 7,554,427 B2 | * | 6/2009 | Matsumoto | H03H 3/04 310/313 A |
| 7,622,846 B2 | * | 11/2009 | Song | H03H 3/02 310/324 |
| 7,675,388 B2 | * | 3/2010 | Cardona | H03H 9/172 333/133 |
| 8,766,512 B2 | * | 7/2014 | Chen | H03H 3/007 310/324 |
| 9,209,781 B2 | * | 12/2015 | Kubota | H03H 9/1092 |
| 2011/0215678 A1 | * | 9/2011 | Kohda | H03H 9/1035 310/344 |

* cited by examiner

*Primary Examiner* — Dean Takaoka
(74) *Attorney, Agent, or Firm* — Wiggin and Dana LLP; Gregory S. Rosenblatt

(57) ABSTRACT

An acoustic resonator comprising a substantially horizontal membrane of piezoelectric material with upper and lower metal electrodes on its upper and lower faces, said membrane being attached around its perimeter to the inner side walls of a rectangular interconnect frame by an attaching polymer, the side walls of the package frame being substantially perpendicular to the membrane and comprising conducting vias within a dielectric matrix, the conducting vias running substantially vertically within the side walls, the metal electrodes being conductively coupled to the metal vias by a feature layer over the upper surface of the membrane and top and bottom lids coupled to top and bottom ends of the interconnect frame to seal the acoustic resonator from its surroundings.

36 Claims, 18 Drawing Sheets

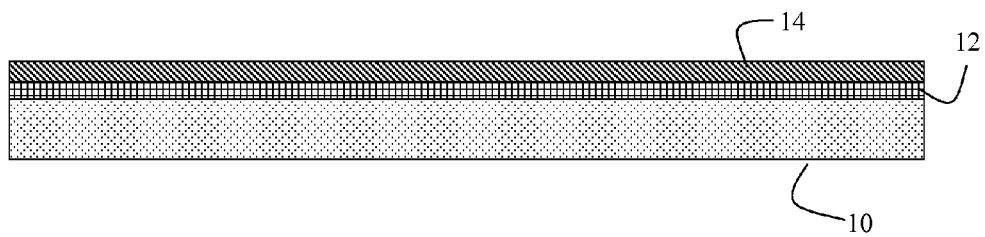
Fig. 1c
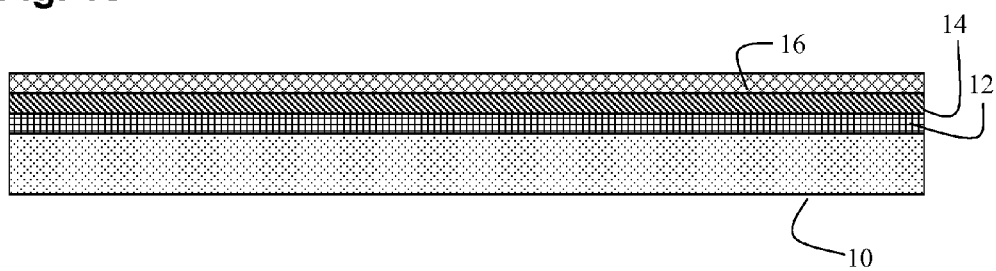
Fig. 1d
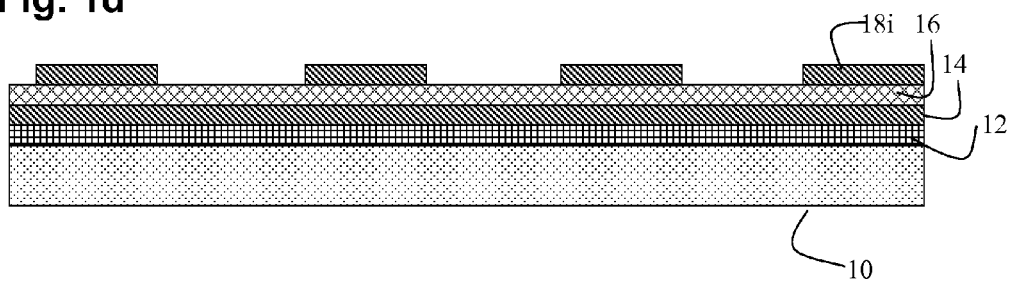
Fig. 1e(i)
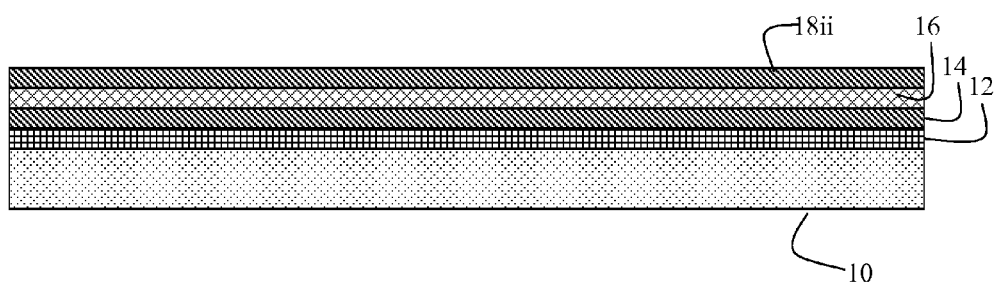
Fig. 1e(ii)

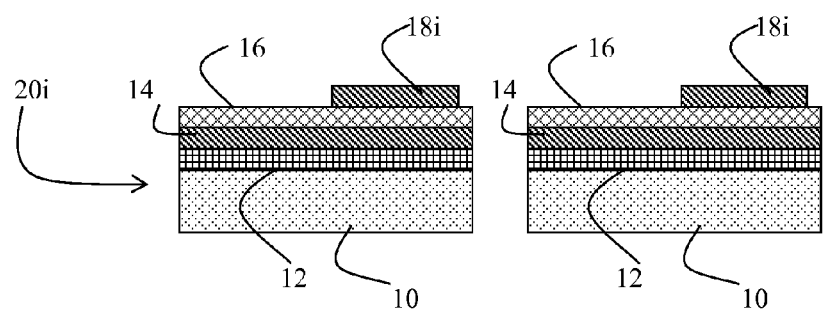
Fig. 1fi
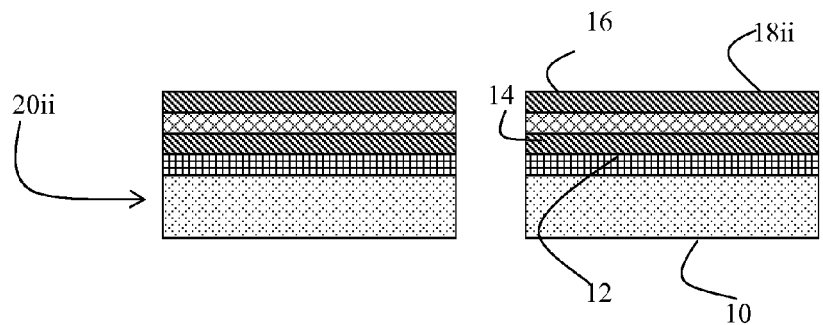
Fig. 1fii

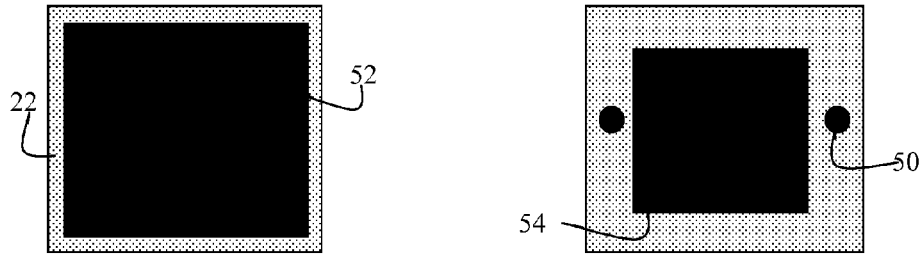
Fig. 21            Fig. 22
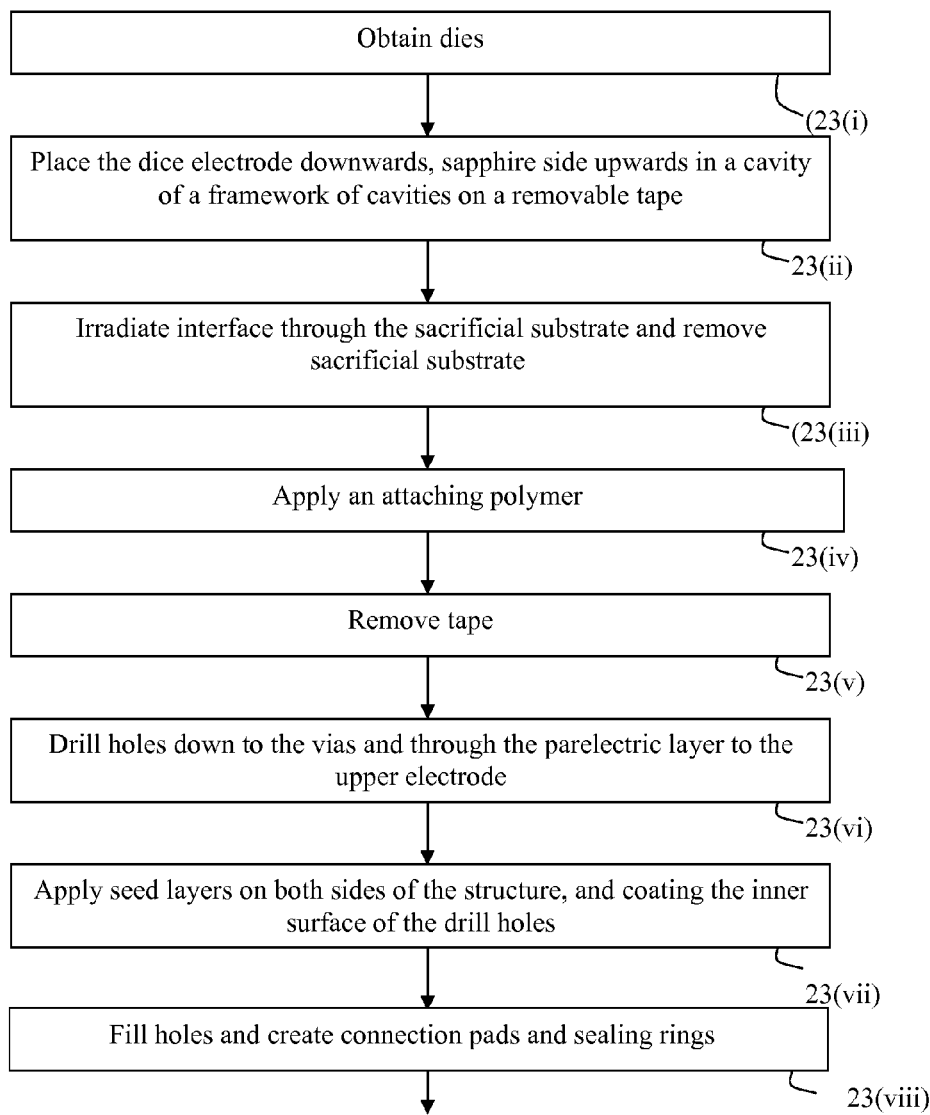

FILM BULK ACOUSTIC RESONATOR FILTER

BACKGROUND

1. Field of the Disclosure

The present invention relates to RF filters for use in mobile phones and the like.

2. Description of the Related Art

Mobile phones are getting smarter. In the transition from so called 3rd generation smart phones to 4th and 5th generation smart phones there has been an explosive growth in radio frequencies and bands. To be able to operate correctly, it is necessary to filter out signals from nearby bands.

RF and microwave applications benefit greatly from the use of tunable devices and circuits. With components that can be tuned over a broad range, filters can be made to tune over multiple frequency bands of operation, impedance matching networks can be adjusted for amplifier power level or antenna impedance.

To meet the demand of ever more sophisticated smart phones and RF devices in automobiles and the like, it is necessary to use different frequency bands for different communication channels, and for different RF frequency devices such as smart phones to co-exist in the presence of frequencies that would otherwise interfere with normal operation. One way to do this is to use FBAR technology as filters.

FBAR (Film Bulk Acoustic Resonator) filters are a form of bulk acoustic wave filter that have superior performance with steeper rejection curves compared to surface acoustic wave filters. They have low signal loss and consequently enable longer battery life and more talk time in mobile telecommunication technology.

When most applications were third generation (3G), only four or five different bands benefited from using FBAR (Film Bulk Acoustic Resonator) filtering. Now, as worldwide carriers move to 4G (fourth generation), filter specifications are much more stringent.

Barium strontium titanate (BST) is a mixed titanate that exists as a centrosymmetric piezoelectric material having a perovskite structure at room temperature. BST has a high dielectric constant, low dielectric loss and low leakage current density and has been used as the dielectric of capacitors.

BST generally has a high dielectric constant so that large capacitances can be realized in a relatively small area. Furthermore, BST has a permittivity that depends on the applied electric field. Consequently, thin-film BST has the remarkable property that the dielectric constant can be changed appreciably by an applied DC-field, allowing for very simple voltage-variable capacitors whose capacitance can be tuned by changing a bias voltage across the capacitor. In addition, the bias voltage typically can be applied in either direction across a BST capacitor since the film permittivity is generally symmetric about zero bias. That is, BST typically does not exhibit a preferred direction for the electric field. These characteristics enable BST to be used as a dielectric within alternating current circuits, such that at a characteristic voltage that depends on the dimensions, the dielectric material resonates and can thus serve as a filter by absorbing electrical energy and changing it into acoustic energy.

U.S. Pat. No. 7,675,388 B2 to Cardona and York describes a switchable tunable acoustic resonator using BST material. The acoustic resonator comprises a pair of electrodes with a barium strontium titanate (BST) dielectric layer disposed therebetween. The device is switched on as a resonator with a resonant frequency if a DC (direct current) bias voltage is applied across the BST dielectric layer. The acoustic resonator is also switched off if no DC bias voltage is applied across the BST dielectric layer. Furthermore, the resonant frequency of the acoustic resonator can be tuned based on a level of the DC bias voltage, with the resonant frequency increasing as the level of the DC bias voltage increases.

In one design described therein, U.S. Pat. No. 7,675,388 B2 describes such acoustic resonators formed on sapphire substrates. In another design described therein, such acoustic resonators are formed over an air gap disposed between the second electrode and a substrate. Also described are acoustic resonators formed over an acoustic reflector disposed between the second electrode and a substrate, where the acoustic reflector is comprised of a plurality of alternating layers of platinum (Pt) and silicon dioxide ($SiO_2$) which reduces the damping of the resonance of the acoustic resonator caused by the substrate.

The BST based acoustic resonator functions can be switched on or off by applying a DC bias voltage and its resonant frequency can be tuned by varying the DC bias voltage. Thus BST based acoustic resonators have many versatile uses in electronic circuits, such as switchable, tunable filters and duplexers for transmitting and receiving a radio frequency signal over an antenna.

BRIEF SUMMARY

A first aspect of the present invention is directed to providing an acoustic resonator comprising a substantially horizontal membrane of piezoelectric material with upper and lower metal electrodes on its upper and lower faces, said membrane being attached around its perimeter to the inner side walls of a rectangular interconnect frame by an attaching polymer, the side walls of the package frame being substantially perpendicular to the membrane and comprising conducting vias within a dielectric matrix, the conducting vias running substantially vertically within the side walls, the metal electrodes being conductively coupled to the metal vias by a feature layer over the upper surface of the membrane and top and bottom lids coupled to top and bottom ends of the interconnect frame to seal the acoustic resonator from its surroundings.

Preferably, the piezoelectric material comprises barium strontium titanate (BST).

Typically, the membrane is further supported from below by a frame of the attaching polymer with an air gap under the lower electrode.

Typically, the acoustic resonator further comprises an interface layer between the attaching polymer and the lower electrode.

Optionally, the interface layer is selected from the group consisting of AlN, TiN, GaN and InN.

Typically, the interface layer has a thickness of 0.5 to 5 microns.

Optionally, the membrane is further attached from above by a frame of the attaching polymer.

Optionally, the lower electrode is accessed from above via a copper lead passing through the BST.

Typically the BST layer comprises a barium to strontium ratio between about 25/75 and about 75/25.

Preferably the BST layer comprises a barium to strontium ratio of about 30/70.

Typically, the BST layer is between 0.1 and 1 micron thick.

Typically, the lower electrode comprises tantalum or platinum.

Typically, the lower electrode has a thickness between 0.1 and 2.5 microns.

Preferably the BST has either a monocrystalline or polycrystalline structure.

Optionally, the upper electrode comprises a layer of aluminum, platinum or tantalum in contact with the BST dielectric.

Optionally the upper electrode further comprises electrodeposited copper.

Preferably the attaching polymer is a liquid crystal polymer.

In some embodiments the interconnect frame comprises a ceramic matrix and metal vias.

In such embodiments, the interconnect frame is fabricated by co-firing with the vias to provide a monolithic ceramic support structure with in-built conductive vias.

Alternatively, the ceramic is cofired with metallic vias using High or Low Temp Cofired Ceramic (HTCC or LTCC) material sets.

Typically, the metal vias comprise a metal selected from the group consisting of Au, Cu and W.

In other embodiments, the frame comprises a polymer matrix and has inbuilt metal vias.

Typically, in such embodiments, the metal vias are copper vias.

Optionally, the frame further comprises ceramic filler and/or glass fibers.

Typically, the depth of the frame is in the range of 150 microns to 300 microns.

Typically, the top and bottom lids are fabricated from a material selected from the group consisting of metal, ceramic, silicon, liquid crystal polymer and Glass.

Preferably the top lid is attached to an upper metal ring fabricated on an upper surface of the interconnect frame and the bottom lid is attached to a lower metal ring on the lower surface of the interconnect frame.

Most preferably the upper metal ring is fabricated on the external edge of the interconnect frame and the lid covers the entire top surface of the frame, the attaching polymer and the upper surface of the membrane.

Most preferably the lower metal ring is fabricated on an inner edge of the lower surface of the interconnect frame to allow the lid to cover the surface of the attaching polymer, the exposed sacrificial carrier and the lower electrode of the membrane, leaving part of the lower surface of the interconnect frame uncovered.

In some embodiments the upper and lower metal rings comprise a surface coating of Ni and Au and the lid comprises a corresponding sealing ring of Eutectic Au/Sn.

Preferably, the acoustic resonator further comprises metal pads extending from vias of the interconnect frame around the bottom lid to below the bottom lid for allowing Solder Surface Mount attachment of the acoustic resonator to a PCB.

In some embodiments, the attaching polymer film extends over the upper surface of the piezoelectric material and upper electrode.

In such embodiments, the attaching polymer film covering the upper electrode has a thickness of up to 5 microns.

A second embodiment is directed to use of the acoustic resonator as a switchable tunable filter.

A third embodiment is directed to use of the acoustic resonator a duplexer for transmitting and receiving a radio frequency over an antenna.

A fourth embodiment is directed to a radio frequency (RF) communications device comprising the acoustic resonator.

BRIEF DESCRIPTION OF THE FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIGS. 1a to 1ei and 1eii are schematic sectional illustrations of the build up of an electroded piezoelectric layer deposited on a sapphire substrate;

FIGS. 1fi and 1fii are schematic sectional illustrations of a plurality of individual dice, each consisting of an electroded piezoelectric film on a sacrificial substrate for use as FBAR core according to a first embodiment;

FIG. 21 is a schematic sectional illustration of structure of FIG. 20 from above, and FIG. 22 is a schematic sectional illustration of structure of FIG. 21 from below;

DETAILED DESCRIPTION

Figure 1:
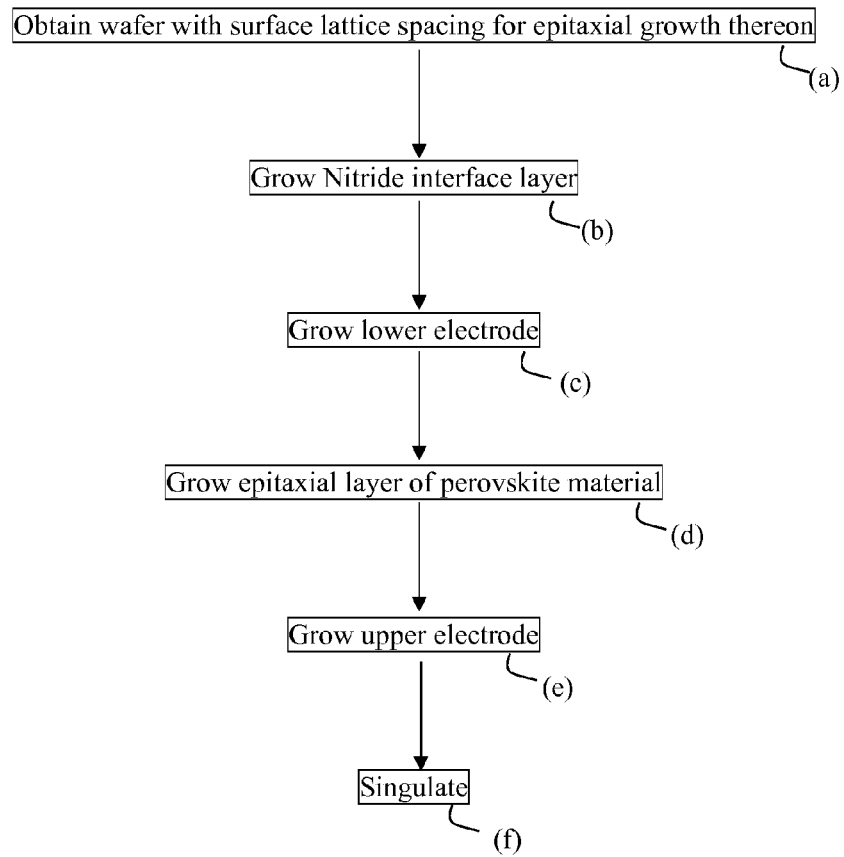
FIG. 1 is a flowchart showing the steps of a manufacturing method for fabricating a sacrificial substrate with a parelectrical material grown thereon between electrode layers.
Figure 1A:
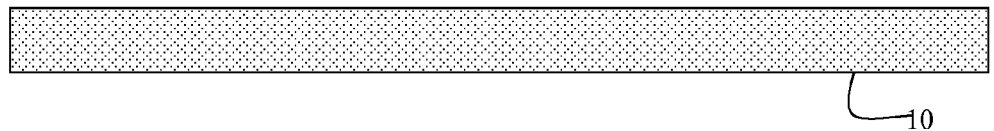
Figure 1B:
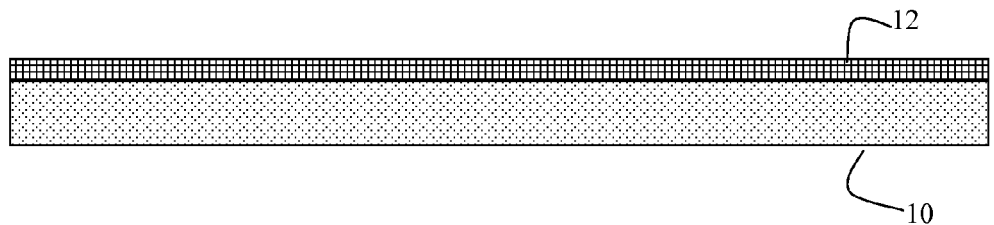

The present invention is directed to an acoustic resonator with a piezoelectric membrane that resonates when an alternating current having an appropriate voltage and frequency is applied. This enables it to convert electrical signals into mechanical energy, and filters RF frequencies that cause noise in RF devices such as mobile phones and the like. The component is thus a switchable tunable acoustic-resonator-filter.

One high performance piezoelectric material the mixed Barium-Strontium Titanate $B_xS_{(1-x)}TiO_3$.

When a signal of around 0.8 MV/cm (19.2V for 2400A of thick BST membrane) is applied to a BST membrane, it resonates. By converting electrical energy into mechanical energy in this manner, BST films may be used as filters that absorb radio frequency electronic signals. Such thin film bulk acoustic resonator FBAR filters with good Q values (>1000) are known.

To achieve high efficiency and reliability, the piezoelectric material is preferably epitaxially grown and may be single crystal or polycrystalline.

BST may be epitaxially grown on a substrate with appropriate lattice spacing. One such substrate is a C-plane <0001> sapphire wafer. These are currently commercially available in diameters of 2", 4" 6" and 8", and in thicknesses of from 75 microns to 500 microns.

The membrane requires inert electrodes on each side and is packaged for protection. To protect from the atmosphere and particularly from moisture, it is preferably hermetically or at least semi-hermetically sealed.

Embodiments of the present invention are directed to packaged paraelectic membranes and to methods of fabrication of such packaged piezoelectric membranes. The packaging is a box consisting of a frame and top and bottom lids. Contacts for surface mounting are provided on the bottom surface of the frame. The frame has vias running through the frame. The bottom lid is attached to the inner perimeter of the bottom surface of the frame and protects the membrane. The vias are coupled to bottom contacts that extend beyond the frame, allowing surface mounting of the packaged components.

An upper end of a first via is coupled to the lower electrode by a connecting pad and an upper end of a second via is coupled to the upper electrode by a second connecting pad. The top lid extends over the membrane, the connecting pads and the upper ends of the first and second vias. In this manner, the connecting pads do not need to run out from under the edge of either lid. Consequently the lids can be securely and tightly attached to the frame providing a high quality seal.

The lids themselves may be ceramic, silicon, glass or metal. Such lids are commercially available. Where hermetic sealing of the component is not required, such as where the component is used in a device that is itself hermetically sealed, the lids may be fabricated from other materials such as polymers. Preferably such polymers are, nevertheless, characterized by ultra low moisture absorption. Liquid crystal polymers LCP) are suitable candidates.

It is a feature of embodiments of the invention that the BST membrane is attached to the surrounding frame by a polymer that surrounds the edges of the membrane and supports the outer perimeter of the lower face. Optionally, the polymer also supports an outer perimeter of the top face. As with the lid, to enhance protection from moisture, preferably the polymer is a liquid crystal polymer LCP.

To obtain high acoustic resonance, the piezoelectric membrane such as BST is preferably epitaxially grown. A good sacrificial substrate for growing BST membranes is the C plane of a single crystal sapphire wafer.

There are a number of variant manufacturing processes which result in slightly different structures.

Common to two manufacturing routes described hereunder, an interface layer that may be AlN, TiN, GaN or InN is first deposited onto the sacrificial substrate. The interface layer may have a thickness of one or two microns (1000 Angstroms to 2000 Angstroms). Remnants of this interface layer under the lower electrode, at least around the perimeter protected by polymer is a good indication that the structure was processed by the fabrication route described hereunder.

A lower electrode that is typically platinum but may be tantalum is deposited over the interface layer. The piezoelectric material (such as BST) is deposited thereover, and a second electrode is deposited over the piezoelectric material. The second electrode may only cover part of the surface of the piezoelectric material and may be deposited into a pattern or panel plated thereonto and partially stripped away. The sapphire wafer is then singulated into individual dice. Each die with the electrodes and piezoelectric membrane is positioned within a cavity of a dielectric gridwork of frames defining cavities with vias running vertically through the frame, typically onto a removable tape, which may be a tacky film forming the bottom of the cavities. In one variant process described hereunder, the die is placed into the cavity with the piezoelectric material and electrodes upwards, and in another variant process described hereunder, the die is placed into the cavity with the piezoelectric material and electrodes downwards. The two variant methods result in slightly different structures also detailed below.

In common to both structures and processes, the sacrificial substrate is removed. This may be achieved by irradiating it through the sacrificial substrate to melt the interface layer. An appropriate laser may be used to irradiate the sapphire sacrificial substrate to metallize and then melt the nitride interface layer. An appropriate laser may have a power of 200–400 mJ/cm$^2$ and may, for example, be an argon fluoride (ArF) excimer laser (laser) with a wavelength of 193 nm or a Krypton fluoride (KrF) excimer laser with a 248 nm wave-length. Sapphire is transparent to these lasers, but the interface layer of AlN, TiN, GaN or InN absorbs the energy and heats up, is converted into the metal and then melts, releasing the sapphire substrate.

In the final structure, the membrane is physically attached to the frame by an attaching polymer that is typically a liquid crystal polymer. The upper and lower electrodes are coupled to the upper ends of vias in the upper end of the frame by copper pads, and a top lid covers the membrane and the upper ends of the vias. A bottom lid covers the cavity below the membrane and is attached to the lower surface of the bottom frame. The cavities above and below the membrane allow it to vibrate, but optionally, to provide mechanical support, the upper surface is coated with a thin layer of polymer, which may be up to about 5 microns thick.

The bottom lid covers the lower aperture beneath the membrane, and is fixed to the frame by a seal around its inner perimeter, such that the lower contacts for surface mounting are attached to the lower end of vias around and beyond the lower lid.

With reference to FIG. 1 and to the build ups shown schematically in corresponding FIGS. 1a to 1f, a method of fabricating the piezoelectric membrane on a sacrificial substrate is now detailed.

Firstly a sacrificial substrate is obtained—step 1(a). This may be a c-cut sapphire ($Al_2O_3$) wafer, for example. The wafer 10 is typically in the range of 100 microns to 250 microns thick. Sapphire wafers are commercially available in a range of diameters, from about 2" to about 8". An interface layer 12 is grown on the surface of the sacrificial substrate 10—step(1b). The interface layer 12 may be a nitride such as AlN, TiN, GaN or InN, for example. The interface layer 12 typically has a thickness of one or two microns, ibut may be from 500 Angstroms to 4000 Angstroms thick.

A lower electrode 14 is then deposited onto the interface layer 12 (step 1c).

Typically the lower electrode 14 comprises an inert metal, such as platinum or tantalum. The thickness of the lower electrode 14 is typically between about 1 and 2.5 microns, and has a structure allowing the epitaxial growth of BST thereupon. The interface layer 12 and the lower electrode 14 may be grown by Molecular Beam Epitaxy MBE.

A layer of piezoelectric material 16, that is typically an epitaxial layer of barium-strontium-titanate BST is grown on the lower electrode (step 1d). In one embodiment, the piezoelectric material 16 is grown by Molecular Beam Epitaxy MBE. Molecular beam epitaxy takes place in high vacuum or ultra-high vacuum ($10^{-8}$ Pa). The low deposition rate of MBE which is typically less than 3000 nm per hour, allows films to grow epitaxially on substrates with appropriate lattice spacing. These deposition rates require a proportionally better vacuum to achieve the same impurity levels as other deposition techniques. The absence of carrier gases as well as the ultra high vacuum environment result in the highest achievable purity of the grown films Alternatively however, other technologies such as pulsed laser deposition, RF sputtering or atomic layer deposition may be used to prepare the thin films of the interface layer 12 (AlN, TiN, GaN or InN, for example), the lower electrode 14 (Pt or Ta for example), and the piezoelectric material 16, BST for example.

Epitaxial growth of the BST 16 is required for good reproducibility and optimum performance. The thin-film of piezoelectric material 16 may be single crystal or polycrystalline. The thickness of the piezoelectric material 16 is typically in the range of from about 1 to about 5 microns, and may be around 2500 Angstrom, for example.

The ratio of barium to strontium in BST thin films may be accurately controlled. For different applications, the selected B/S ranges may be varied from about 25/75 to about 75/25 but preferably is in the range of from about 30/70 to about 70/30. The appropriate ratio is governed by film thickness, the maximum resonating field (V/um), and the relative proportions of the ions in the mixed structure may be used to optimize the Q factor.

Upper electrodes are now fabricated on the piezoelectric material 16 (step 1e). In one variant (shown as FIG. 1ei), an array of discontinuous upper electrodes 18i is fabricated on the piezoelectric layer 16. The discontinuous upper electrodes 18*i* may be sputtered and then selectively etched using a photoresist mask, or may selectively sputtered into a photoresist mask.

Alternatively, in the variant shown in FIG. 1*eii*, a continuous upper electrode 18*ii* is fabricated on the piezoelectric layer 16.

The upper electrodes 18*i*, 18*ii* typically have thicknesses of around 1 micron.

Typically, the upper electrode 18*i*, 18*ii* will comprise a double layer, having a first layer of aluminum, platinum or tantalum in contact with the BST and a second layer of copper deposited thereover. As illustrated by FIGS. 1*a* to 1*ei*, 1*eii*, these steps are generally accomplished in a large array of components on a sapphire wafer.

At this stage, the sacrificial substrate 10 (e.g. wafer of sapphire) may be diced into individual components or dice 20*i* (20*ii*). Such individual dice are shown in FIGS. 1*fi* and 1*fii*.

The dice 20*i* (20*ii*) may be positioned within the cavities defined by a grid of interconnect frames on a sacrificial substrate. There are two main processing routes. In the first processing route described with reference to FIG. 2, and to schematic illustrations 3 to 22 the dice 20*i* may be positioned with the piezoelectric layer 16 and electrodes 14, 18*i* uppermost, or, in a second processing route described with reference to FIG. 23, and to schematic illustrations 24 to 36, the dice 20*ii* may be positioned with the piezoelectric layer 16 and electrodes 14, 18*ii* uppermost.

Figure 2:
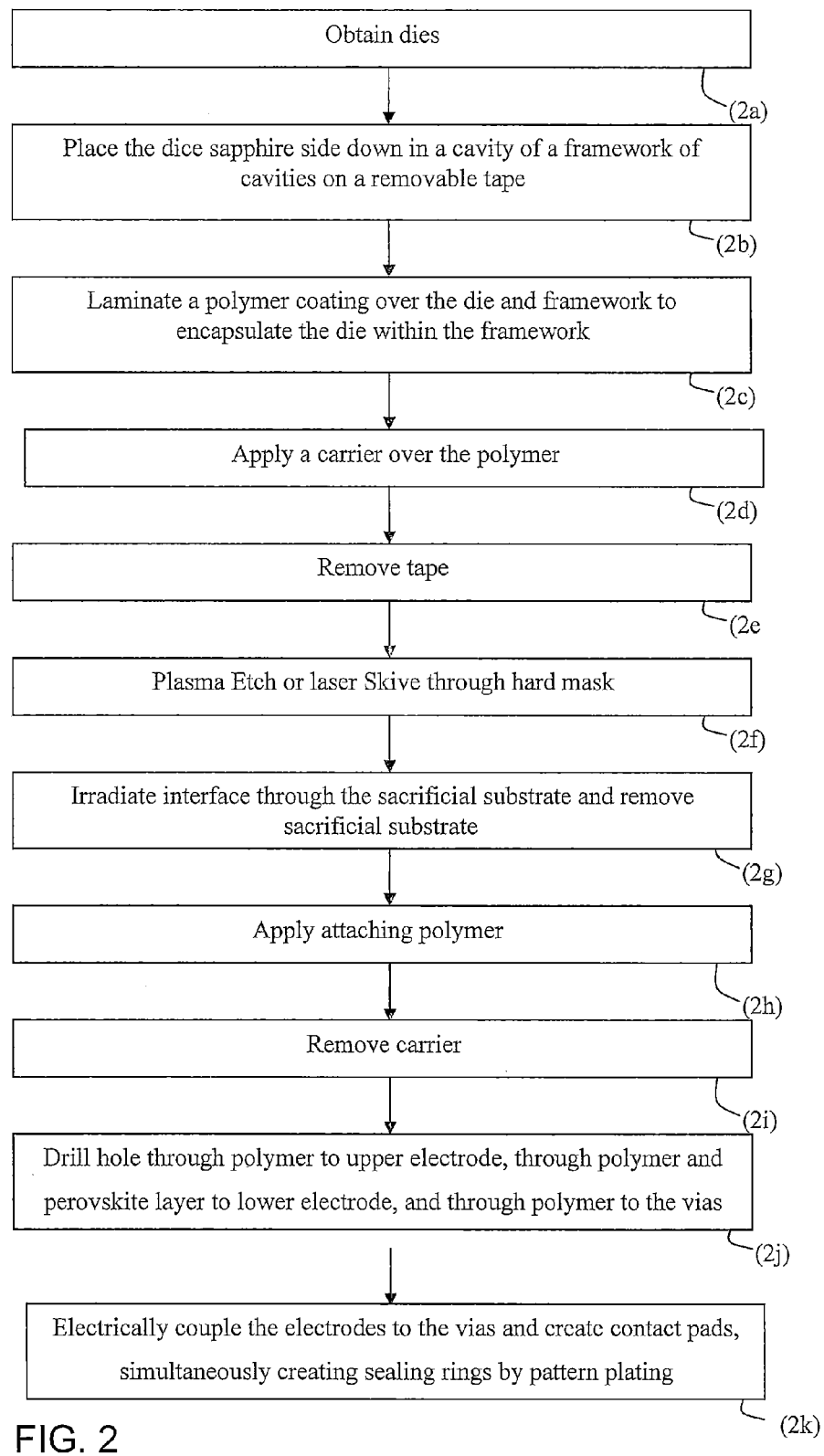
FIG. 2 is a flowchart showing how an acoustic resonator of one embodiment may be fabricated.
Figure 2:
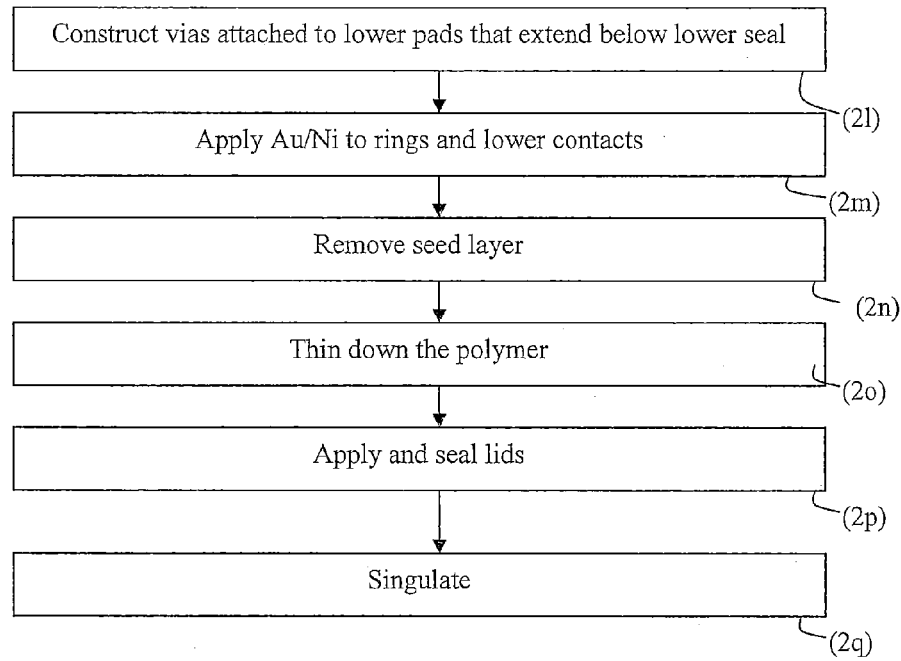

With reference to the flowchart of FIG. 2, a first processing route for fabricating packaged thin film bulk acoustic resonators FBAR filter with good Q values is presented.

The individual dice 20*i* of FIG. 1*fi* obtained via the process shown in FIG. 1 may be positioned piezoelectric layer 16 and electrodes 14, 18*ii* uppermost onto a ring tape in readiness for pick & place.

In this first processing route the individual dice 20*i* are placed sacrificial substrate 10 downwards (i.e. electrode 18*i* upwards) in the cavities 25 defined by a grid of interconnect frames on a removable tape 26—step (2*b*).

Figure 3:
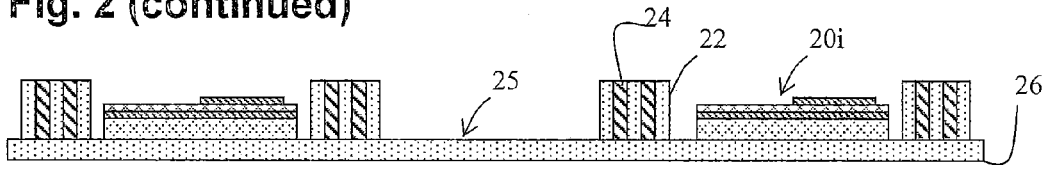
FIG. 3 is a schematic sectional illustration of a fiber reinforced polymer interconnect framework of cavities, with the dice of FIG. 1fi positioned in the cavities.
Figure 4:
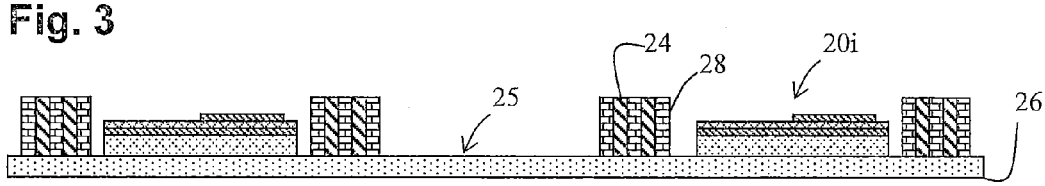
FIG. 4 is a schematic sectional illustration of a ceramic interconnect framework of cavities, with the dice of FIG. 1fi positioned in the cavities.

The grid of interconnect frames may be a polymer grid of interconnect frames 22 with embedded copper vias 24 as shown in FIG. 3, or a ceramic grid of interconnect frames 28 with embedded copper vias 24 as shown in FIG. 4. The removable tape 26 may be a tacky polymer membrane, for example. In general, ceramic grids of interconnect frames 28 with conducting vias 24 running vertically there through may be fabricated by LTCC or HTCC. Such ceramic grids are commercially available. Ceramic interconnect frames have better hermetic sealing. Polymer frames may, however provide adequate sealing for some applications and will generally be cheaper to manufacture and process.

With reference to FIG. 3, if a polymer matrix grid of interconnect frames 22 is used, a high Tg polymer with a glass transition temperature above 280° C. and preferably above 300° C. should be used. It is essential that the polymer 22 has a low take-up of water. Liquid crystal polymers are ideal. Where the grids of interconnect frames has a polymer matrix, it is preferable that the matrix and/or the polymer used for attaching the piezoelectric membrane is liquid crystal polymer (LCP).

With reference to FIG. 4, where the grid of interconnect frames 28 is ceramic, it may be a monolithic ceramic support structure that is cofired with in-built conductive vias 24 of gold, copper or tungsten, for example. The co-fired ceramics technology is established in multi-layer packaging for the electronics industry, such as military electronics, MEMS, microprocessor and RF applications. One manufacturer is Murata. Both high and low temperature cofired ceramics, HTCC and LTCC are known. Such structures are available in arrays of up to 8"×8", and, whilst not allowing the same throughput as the polymer grid of interconnect frame technology developed by Zhuhai Access, is, nevertheless, an alternative that allows true hermetic sealing.

Whichever type of grid of frames 22, 28 is used, the depth of the grid of interconnect frames is about 50 microns thicker than that of the dice 20 and is typically in the range of 150 microns to 300 microns. Due to the additional thickness of the frame 22 (28), mechanical pressure on the piezoelectric membrane 16 is avoided. This is important since piezoelectric structures such as BST convert mechanical stress to voltage differences there-across, and convert electrical signals there-across to mechanical deformations.

The grid of interconnect frames 22 (28) is positioned on a removable tape 26 which may be a tacky membrane, for example. A pick & place robot may be used to position the dice 20*i* with the sacrificial substrate 10 face down, and the piezoelectric layer 16 and upper electrode 18*i* face up within each socket of the grid of interconnect frames 22 (28)—step (2*b*).

Since the subsequent processing is the same for both ceramic and polymer grids of interconnect frames, the process is now explained using figures that illustrate a grid of polymer interconnect frames. This proprietary technology has been developed by Zhuhai-Access and enables fabrication in very large arrays on framework panels that are currently up to 21"×25". However, as stated hereinabove, ceramic grids of interconnect frames of up to about 200 mm×200 mm are commercially available and may be used instead.

Figure 5:
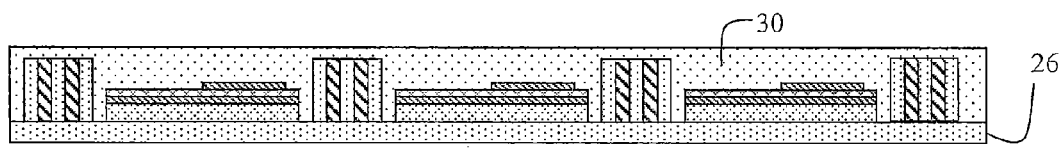
FIG. 5 is a schematic sectional illustration of the fiber reinforced polymer interconnect framework of cavities of FIG. 3, with the dice of FIG. 1fi positioned in the cavities, and subsequently laminated with an attaching polymer film.

The dice 20*i* and framework 22 (28) are laminated with an attaching polymer 30—step (2*c*). A schematic illustration of dice 20*i* within the cavities 25 of a polymer interconnect framework 22 with attaching polymer 30 is shown in FIG. 5. There are a number of commercially available candidate materials for the attaching polymer 30. By way of non-limiting illustration only, these include: Ajinomoto ABF-T31, Taiyo Zaristo-125, Sumitomo LAZ-7751 and Sekisui NX04H.

Preferably, however, the attaching polymer 30 is a liquid crystal polymer. Liquid crystal polymer films may be processed at temperatures in the range of 240° C. to 315° C. Such materials have very low permeability to water and help protect and seal the piezoelectric membrane.

The thickness of the attaching polymer 30 is generally about 50 microns more than the depth of the frame 22.

Figure 6:
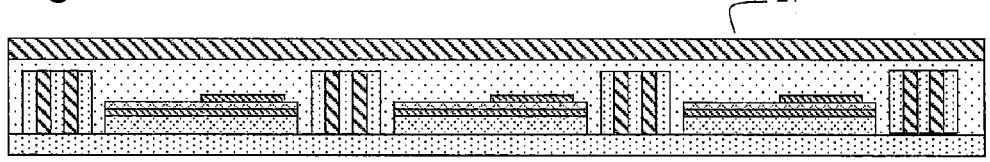
FIG. 6 is a schematic sectional illustration of the structure of FIG. 5, with a carrier attached.

A carrier 27 is applied over the attaching polymer 30 (step 2*d*). The carrier may be a metal carrier, such as a copper carrier, for example. The resulting structure is schematically shown in FIG. 6.

Figure 7:
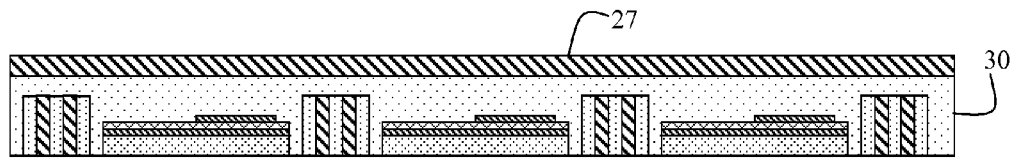
FIG. 7 is a schematic sectional illustration of the interconnect framework of FIG. 6 with the sacrificial substrate removed.

The removable tape 26 is now removed, exposing the sacrificial substrate 10 and the bottom ends of the frame 22, including the vias 24 (step 2*e*). The resulting structure is schematically shown in FIG. 7.

Figure 8:
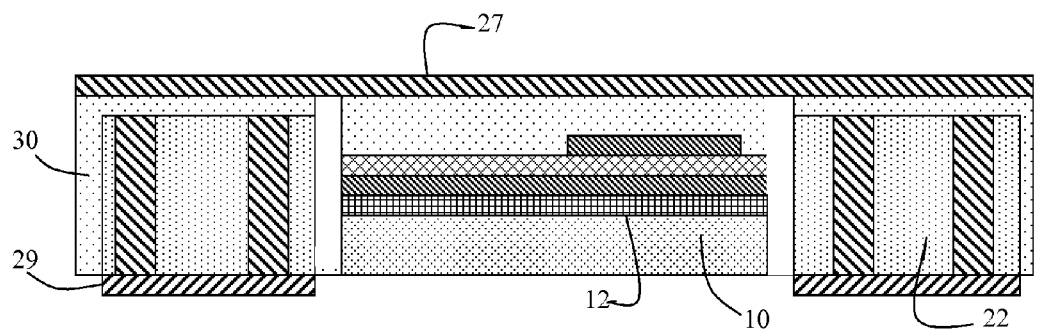
FIG. 8 is a schematic sectional illustration of the structure of FIG. 7 with holes the polymer film around the die removed through to the carrier.

Referring to FIG. 8 which is an enlarged schematic focusing on one component, but noting that the processing typically occurs in an array, the attaching polymer 30 around the die 20*i* is removed down to the carrier 27 (step 2*f*). Plasma etching or laser skive-away may be used. A hard mask 29, such as a stainless steel mask may be used to protect the frame 22 (28).

Figure 9:
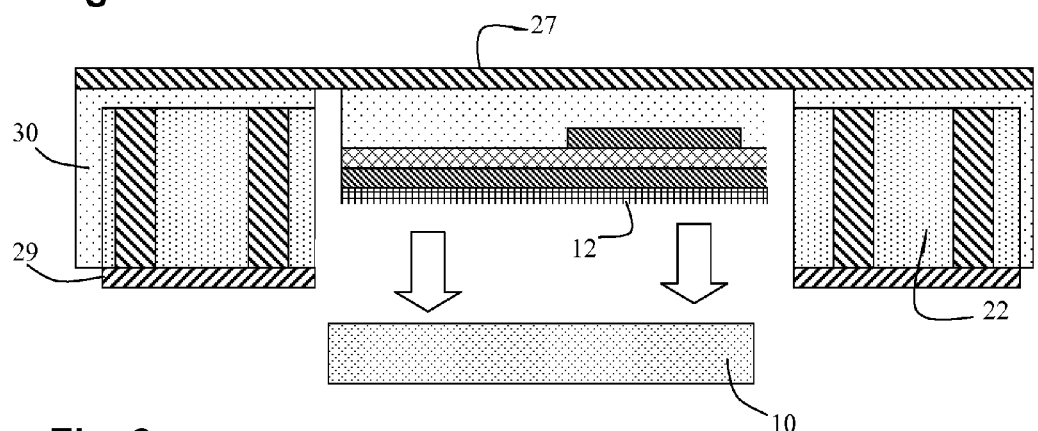
FIG. 9 is a schematic sectional illustration of the structure of FIG. 8 with sacrificial substrate detached.

The sacrificial substrate 10 is then removed (step 2*g*). One way of achieving this is by laser irradiation through the sacrificial substrate 10, heating and melting the interface 12. Where the interface is a nitride layer, this may be reduced to the metal and then melted. The laser irradiation may use a patterned laser with a power of 200~400 mJ/cm². An argon fluoride (ArF) excimer laser (laser) with a wavelength of 193 nm or a Krypton fluoride (KrF) excimer laser with a 248 nm wave-length may be used. Sapphire substrates are transparent to these lasers, but the nitride layer absorbs them and heats up, is converted into the metal and then melts, releasing the sapphire substrate which is lifted away leaving the structure of FIG. 9.

Figure 10:
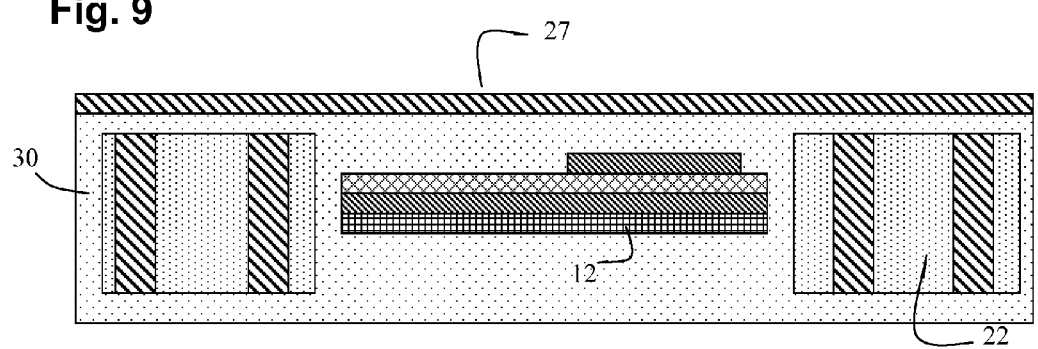
FIG. 10 is a schematic sectional illustration of the structure of FIG. 9 laminated with attaching polymer, filling the spaces around the membrane, the cavity left by the removal of the sacrificial substrate and covering the frame by a further 50 microns or so.
Figure 11:
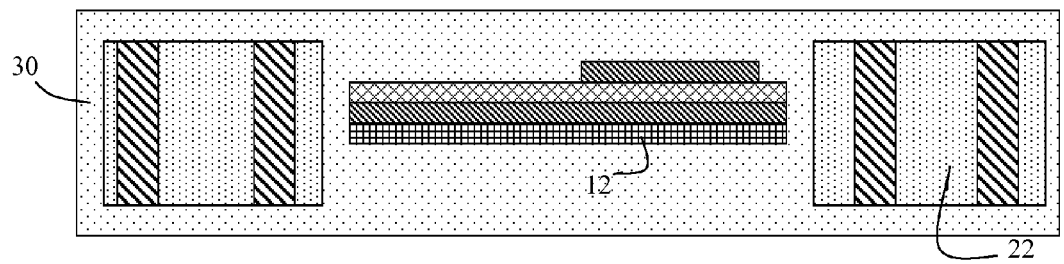
FIG. 11 is a schematic sectional illustration of the structure of FIG. 10 with the carrier removed.

Referring to FIG. 10, the attaching polymer 30 is applied (step 2h), filling the space around the perimeter of the nitride 12, electrodes 14, 18i and piezoelectric membrane 16, attaching them to the frame 22, 28 and filling the cavity left by the removal of the sacrificial substrate 10. The attaching polymer 30 also extends below the frame 22, 28 a further 50-150 microns. In one embodiment, The carrier 27 is now removed. Where carrier 27 metal, such as copper, for example, it may be etched away (step 2i) giving the structure shown schematically in FIG. 11.

Figure 12:
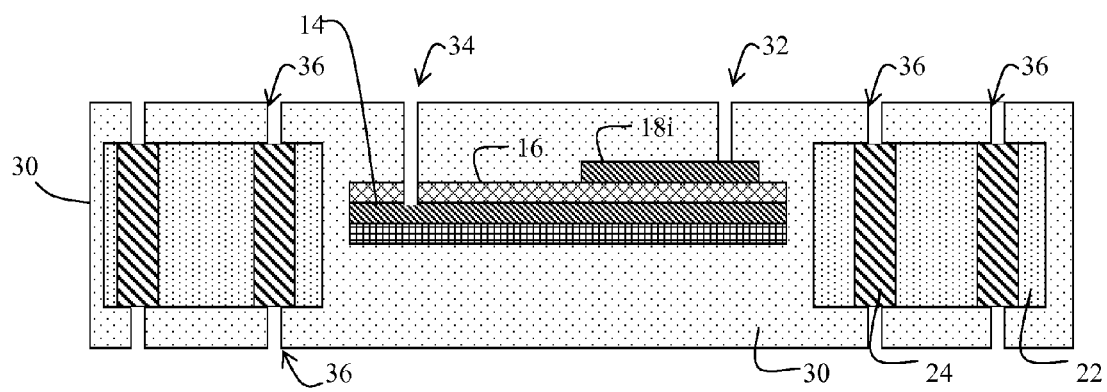
FIG. 12 is a schematic sectional illustration of the structure of FIG. 11 with holes drilled through to the vias, and holes drilled through the attaching polymer to the upper electrode, and through the attaching polymer and the membrane to the lower electrode.

With reference to FIG. 12, showing one membrane 16 encapsulated in the attaching polymer 30 within a cavity of a polymer grid of interconnect frames 22 with conductive vias 24 therethrough, the upper electrode 18i may be accessed by drilling a hole 32 through the attaching polymer 30, and the lower electrode 12 may be accessed by drilling a second hole 34 through the attaching polymer 30 and the piezoelectric membrane 16, stopping once the lower electrode layer 14 is reached. Holes 36 may also be drilled through to the copper vias 24 from both sides (step 2j). In one embodiment, laser drilling is used. In another embodiment, plasma etching is used whilst protecting the surrounding attaching polymer 30 with an appropriate mask, such as a stainless steel (e.g. 304 SS and 316 SS) hard mask (29 see FIG. 9), for example. Optionally, a combination of laser drilling and plasma etching may be used.

The drill holes 32, 34, 36 are now filled with copper, and coupled to the vias 24 through the interconnect framework 22 step (2k). At the same time, sealing rings are fabricated.

Figure 13:
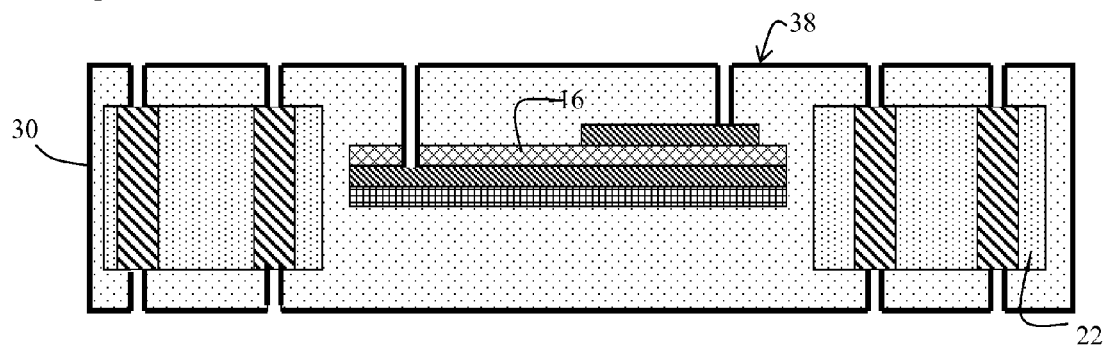
FIG. 13 is a schematic illustration of the structure of FIG. 12 with a seed layer covering the surface, including the surfaces of the drill holes.

With reference to FIG. 13, this step may be achieved by first sputtering a seed layer such as titanium Ti, a mixture of titanium and tantalum Ti/Ta or titanium and tungsten Ti/W. over the drill holes 32, 34, 36 and the surface of the polymer 30 and then sputtering a layer of copper 38 thereover.

Figure 14:
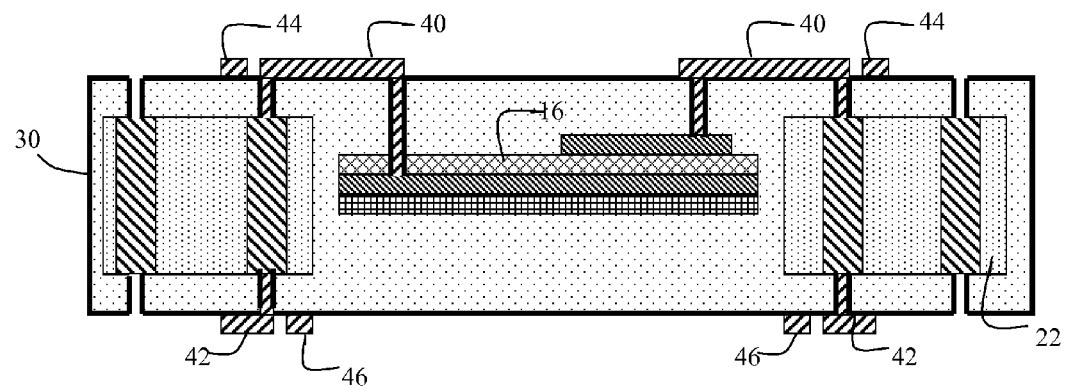
FIG. 14 is a schematic illustration of the structure of FIG. 13 with drill holes filled and contact pads connecting the filled drill holes to the vias and electrodes, lower pads connected to the lower ends of the vias, and forming upper and lower sealing rings.

Copper is then pattern plated into the drill holes, the filled drill holes are coupled to the vias by upper pads 40 and lower pads 42 are created that allow surface mounting and provide access to the vias 24. Sealing upper and lower sealing rings 44, 46 are fabricated on both sides of the framework giving the structure shown in FIG. 14. This may be achieved by applying a photoresist, patterning, electroplating and removing the photoresist. Pads 42 connect the electrodes to the vias in the frame. Upper and lower sealing rings 44, 46 are deposited. The resulting structure is shown in FIG. 14.

Figure 15:
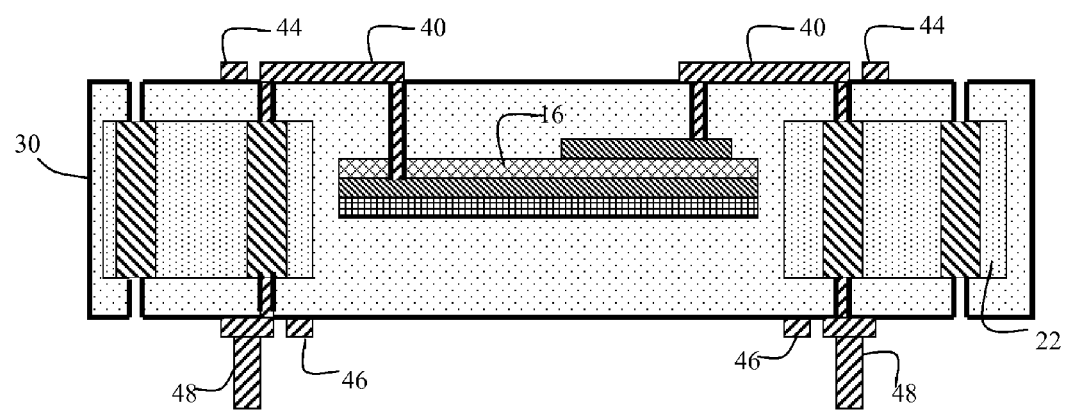
FIG. 15 is a schematic illustration of the structure of FIG. 14 with via posts grown from the lower pads to well below the lower sealing ring for surface mounting, such as for coupling to a land grid array LGA.

With reference to FIG. 15, lower Cu pillars 48 are deposited by applying a photoresist, patterning, electroplating and removing the photoresist. The lower copper pillars 48 form a land grid array LGA or a ball grid array BGA pad and must be at least a 100 microns thick. The lower sealing ring 46 excludes the lower copper pillars 48. The upper sealing ring 44 surrounds the membrane 16 and pads 40 to allow hermetic sealing of a lid over and around the pads. Typically it is fabricated on what will become the outer perimeter of the top surface of the interconnect frame, once the interconnect framework is sectioned into individual components.

Figure 16:
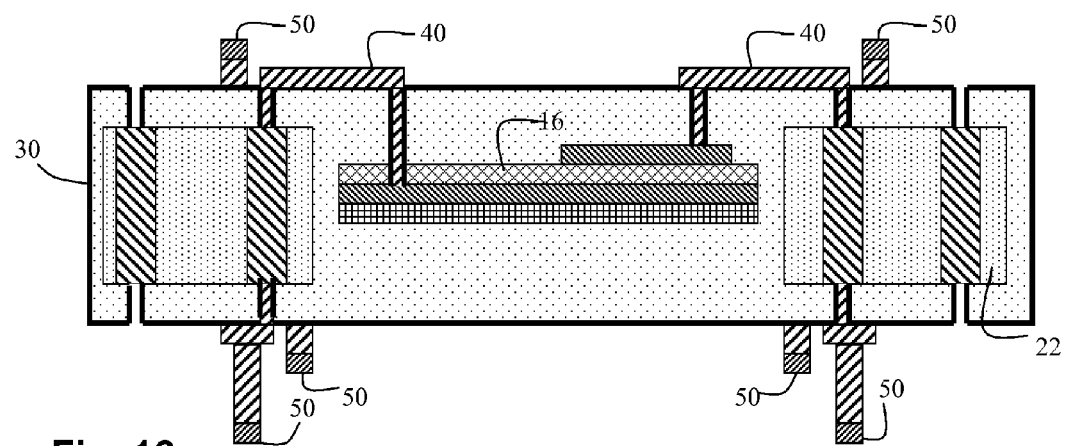
FIG. 16 is a schematic sectional illustration of the structure of FIG. 15 with contact pads and ring seals coated with nickel, gold or nickel gold terminations.

Referring to FIG. 16, to facilitate adhesion, the sealing rings 44, 46 and pillars 48 may be coated with Ni, Au or Ni/Au 50 (step 2m).

Figure 17:
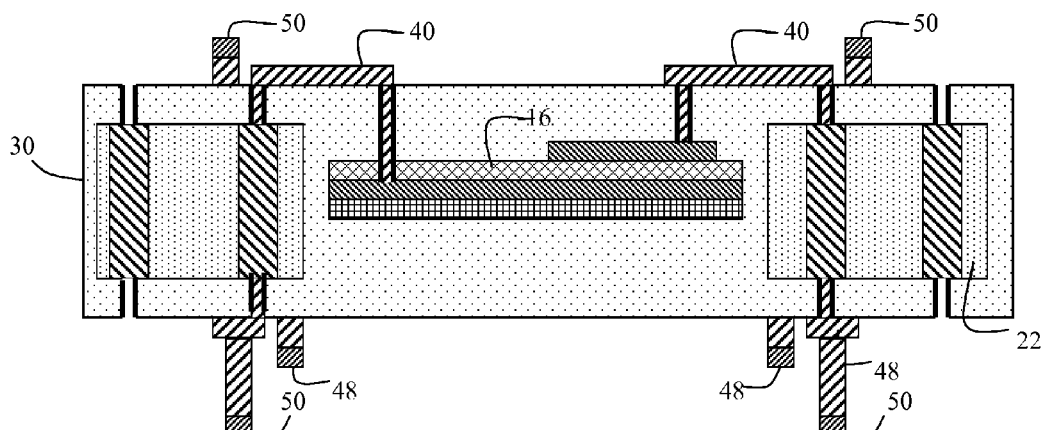
FIG. 17 is a schematic sectional illustration of the structure of FIG. 16 with the seed layer etched away.

Referring to FIG. 17, the seed layers are then removed (step 2n).

Figure 18:
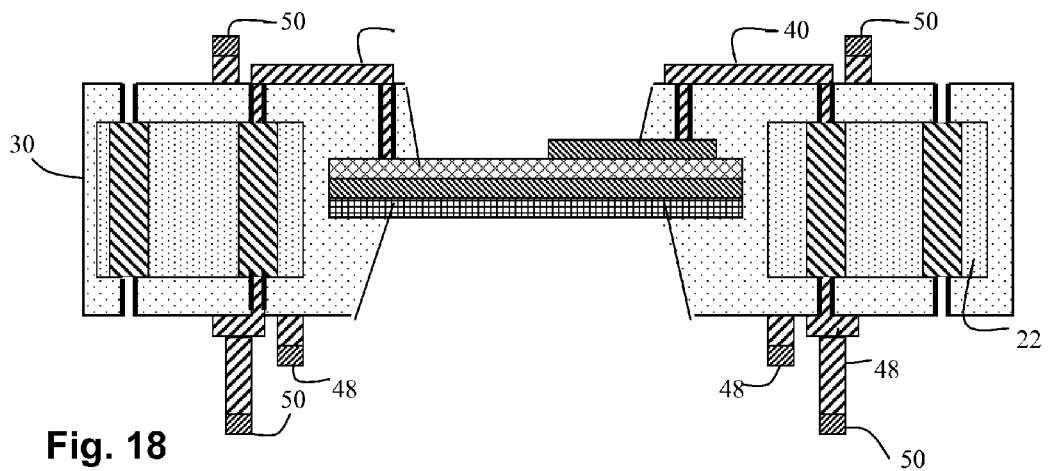
FIG. 18 is a schematic sectional illustration of structure of FIG. 17 with the attaching polymer under on both sides of the membrane substantially thinned away and the interface layer removed.

Next, the attaching polymer 30 covering the piezoelectric membrane 14 may be thinned down from each side (step 2o) using a controlled plasma to erode between the electrodes producing the structures of FIG. 18. The purpose of thinning away the film of attaching polymer is to allow the piezoelectric membrane 16 to resonate. Optionally, a thin layer (up to 5 microns) of polymer is nevertheless retained over the piezoelectric membrane 16 to provide mechanical support. The thickness of the attaching polymer film 30 above the top electrode 18i may be tailored to any desired thickness depending on the desired Q of the BST FBAR.

Figure 19:
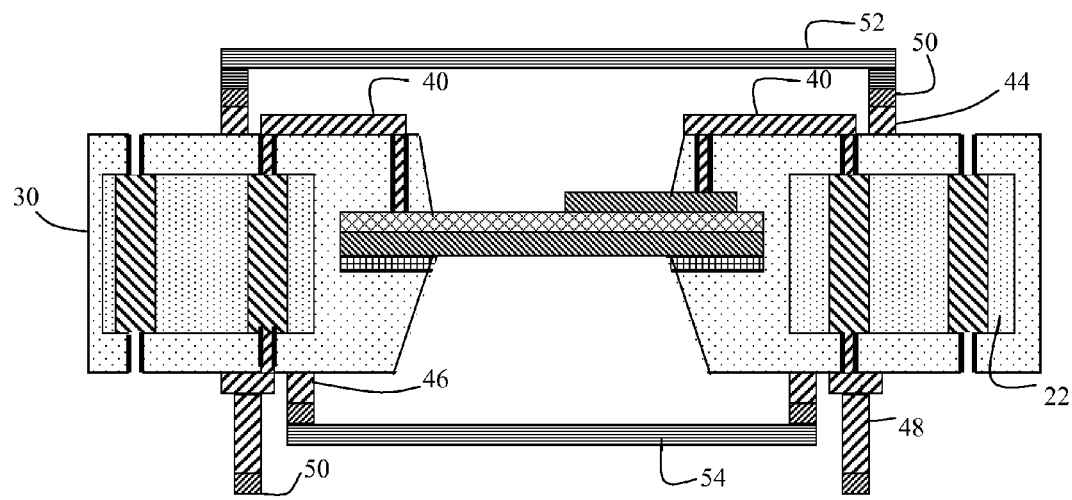
FIG. 19 is a schematic sectional illustration of structure of FIG. 18 with lids applied above and below the membrane, the lids being sealed to the interconnecting frame by ring seals, providing hermetic sealing.

Optionally, as shown in FIG. 19, the attaching polymer film 30 may be removed right down to the piezoelectric membrane 16.

Figure 20:
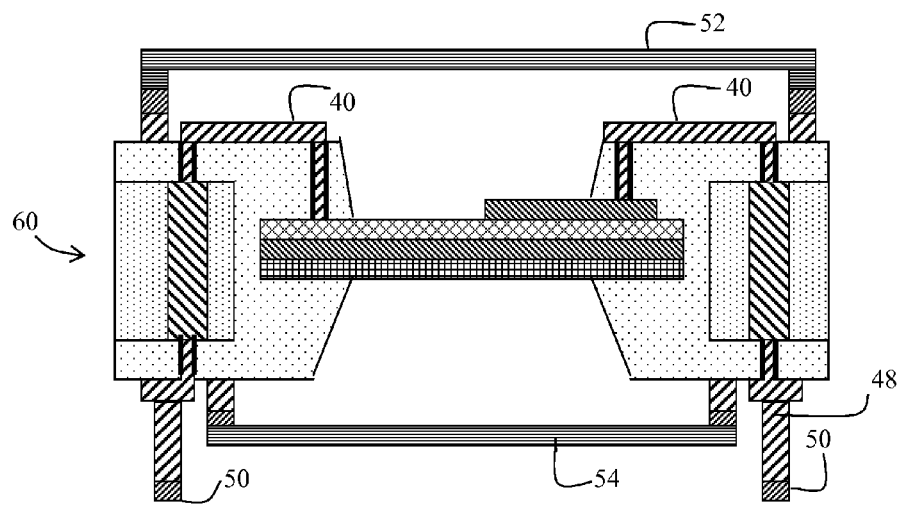
FIG. 20 is a schematic sectional illustration of structure of FIG. 18 after singulation from the grid of frameworks.

Referring to FIG. 20, top and bottom lids 52, 54 are positioned under and over the piezoelectric membrane 16, coupling to the Ni/Au sealing rings on the interconnect framework (step 2p). Using As/Sn sealing ring contacts on the lids 52, 54 that correspond to the Ni, Au or Ni/Au coated 50 sealing rings 44, 46 on the frame of the package enables reflow at the As/Sn eutectic which occurs at temperatures of about 320°-340° C. and seals the lids 52, 54 in position on the top and bottom of the package frame thereby hermetically encasing the piezoelectric membrane 16.

Any commercially available lids 52, 54 may be used. The lids 52, 54 may be LCP, ceramic, silicon, glass or metal. Such packaging solutions are used in MEMS packages. Lids that are plated with nickel and gold and provided with a gold tin eutectic frame for sealing are commercially available and conform to military standards. Also available are ceramic lids with glass sealants.

The lids 52, 54 may be positioned and bonded in place onto the sealing rings 44, 46 of the frame within an inert gas environment, such as a nitrogen environment, for example, protecting the BST membrane from oxygen and moisture.

Preferably the top lid 52 covers the pads 40 that connect the membrane to the vias in the frame, whereas the bottom lid 54 does not extend out to the lower copper pillars 48 for surface bonding the package 60 to a substrate. Consequently, it becomes unnecessary to run conductors under either lid which would deteriorate their sealing performance.

The lower copper pillars 48 for surface mounting of the component extend below the bottom lid 54.

At this stage, the grid of interconnect frames may be singulated (step 2q) into separate components 60 each encased between top and bottom lids 52, 54, and a surrounding interconnect frame 22. See FIG. 20. Alternatively, the singulation may have occurred previously or may occur after additional steps.

Top and bottom views are shown in FIGS. 21 and 22.

It will be noted that there are also typically traces of the interface layer 12 under the bottom electrode 14, between the bottom electrode 14 and the supporting polymer 30. The interface layer may be AlN, TiN, GaN or InN, or Al, Ti, GA or In. This interface layer is a good indication that the structure was processed by one of the fabrication routes described herein, or by a variant thereof.

Figure 23:
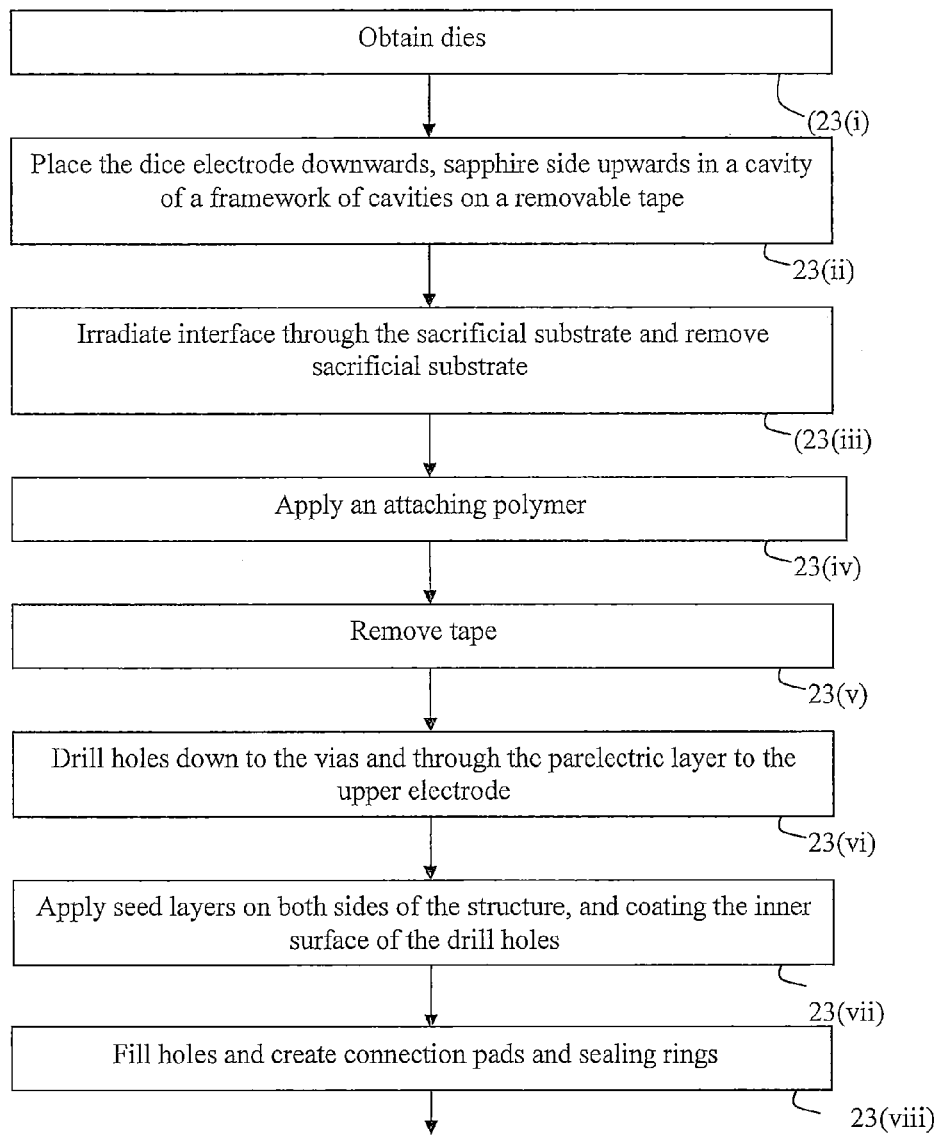
FIG. 23 is a flow chart showing a manufacturing route of a variant structure.
Figure 23:
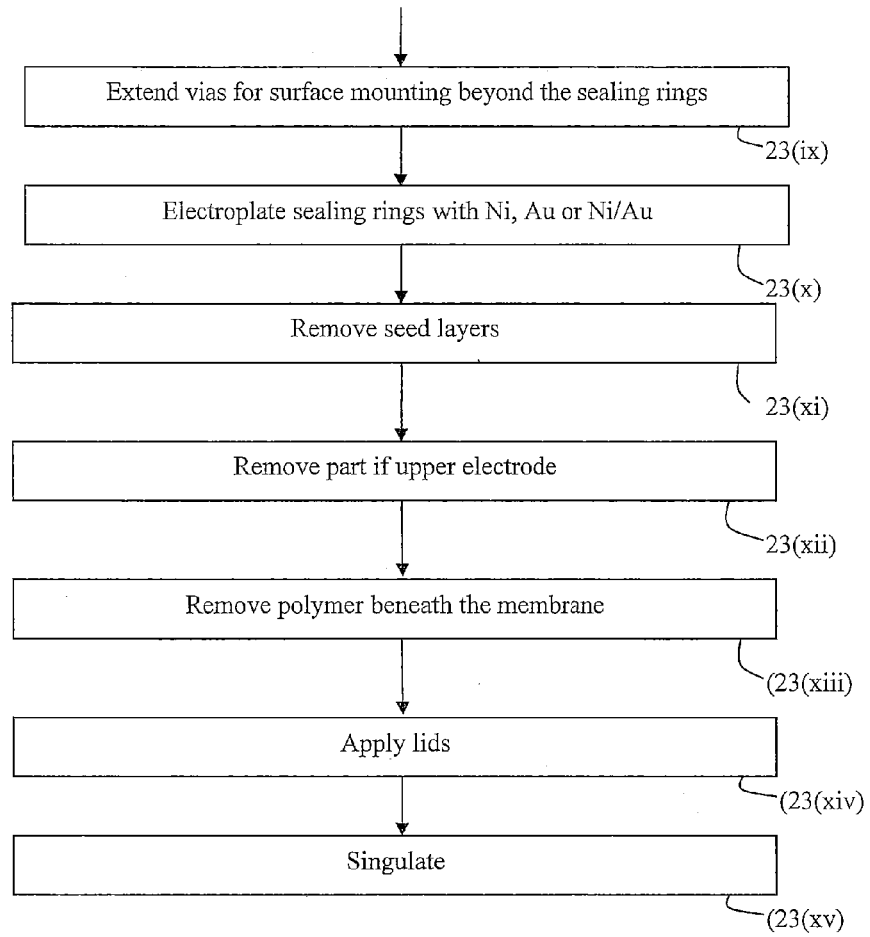

With reference to FIG. 23, a variant process is shown. Essentially the main difference between the first fabrication route shown in FIG. 2 and the second fabrication route shown in FIG. 23 is that in the process shown in FIG. 23 the die 20ii is positioned face down in the cavity 25 of a framework of cavities. Once again the framework may be a polymer framework 22 or a ceramic framework 28 and will include metallic vias 24 therethrough. Firstly, dies with the piezoelectric membrane are obtained—step 23(i). The process shown in FIG. 1 may be used.

The dice are placed electrode downwards, sacrificial substrate upwards in a cavity of a framework of cavities on a removable tape—step 23(ii).

Figure 24:
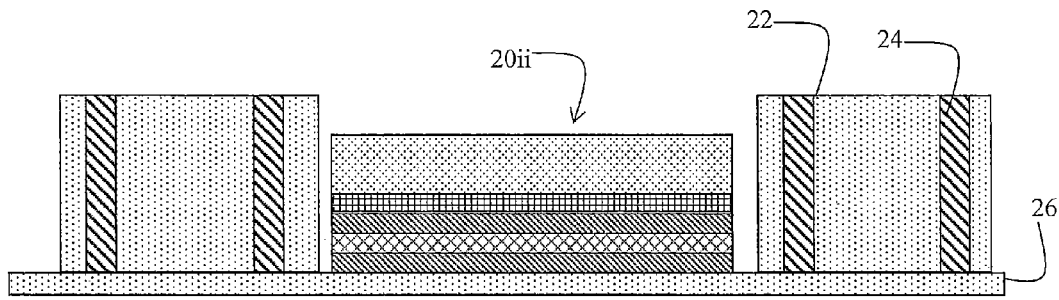
FIG. 24 is a schematic sectional illustration of a single cavity and surrounding frame that is part of a grid of a fiber reinforced polymer interconnect framework of cavities, with a die of FIG. 1*fii* positioned in the cavity, resting face downwards, with the sacrificial substrate face upwards on a removable tape.

A framework 22 with dies 20ii positioned electrode 18ii downwards (sacrificial substrate 10 upwards) on a removable tape 26 is schematically shown in FIG. 24.

Figure 25:
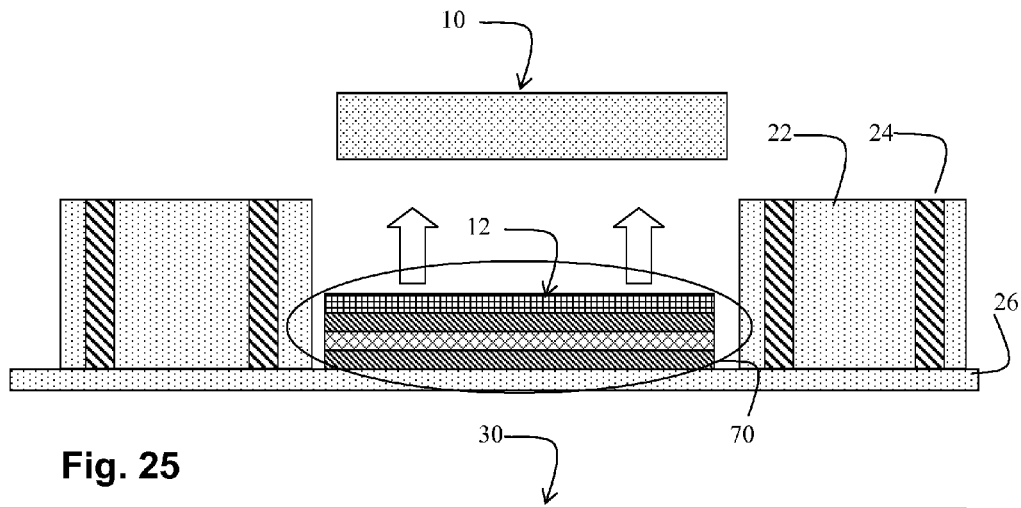
FIG. 25 is a schematic sectional illustration of the single cavity, surrounding frame and die of FIG. 1*fii* face downwards, showing the sacrificial substrate being lifted off and away.

In this variant process, the interface layer 12 is now irradiated through the sacrificial substrate using a laser to melt the interface layer and the sacrificial substrate is lifted away—step 23(iii) giving the structure shown in FIG. 25.

Figure 26:
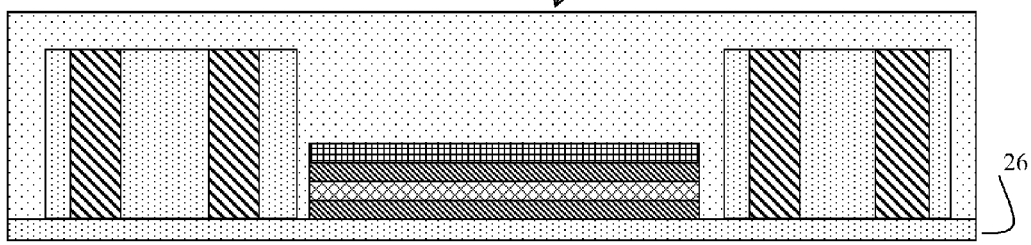
FIG. 26 is a schematic sectional illustration of the structure of FIG. 25 laminated with an attaching polymer that fills the space between the membrane and the frame, covers any remaining material from the interface layer, and fills the frame, overfilling by about 50 microns.

The polymer framework 22 or ceramic framework 28 with metallic vias 24 therethrough, and having the electroded piezoelectric thin film 70 in the cavities thereof 25, on the removable tape 26 is then coated with an attaching polymer 30 that attaches the electroded piezoelectric thin film 70 to the framework 22 (28) and extends 50-150 microns beyond the framework 22, 28—step 23(iv) giving the structure shown in FIG. 26. The attaching polymer 30 may be applied as a film, for example. Preferably, a liquid crystal polymer is used to minimize moisture absorption.

Figure 27:
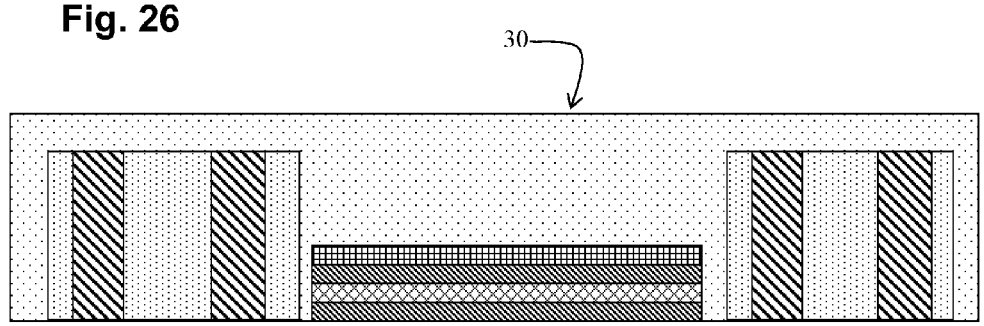
FIG. 27 is a schematic sectional illustration of the structure of FIG. 26 with the removable tape removed, exposing ends of the framework and the vias.

The removable tape 26 is now removed—step 23(v), giving the structure shown in FIG. 27.

Figure 28:
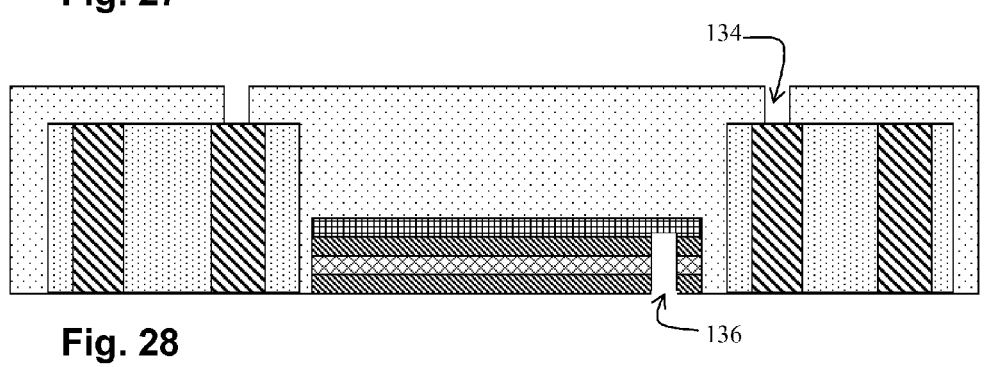
FIG. 28 is a schematic sectional illustration of the structure of FIG. 27 with holes through the polymer film down to the opposite ends of the vias, and hole drilled through the outer electrode and piezoelectric membrane to the inner electrode (as illustrated, the holes are through the polymer to the upper ends of the vias, and through the lower electrode and membrane to the upper electrode, but the structure is about to be turned over . . . )

Holes 134 may be drilled through the polymer down to the vias 24 in the frame, and a further hole 136 may be drilled through the piezoelectric layer 16 to access the inner electrode 14 through giving the structure shown in FIG. 28—step 23(vi). The holes 136, 138 may be fabricated by laser drilling and/or by selective plasma etching through a mask.

Figure 29:
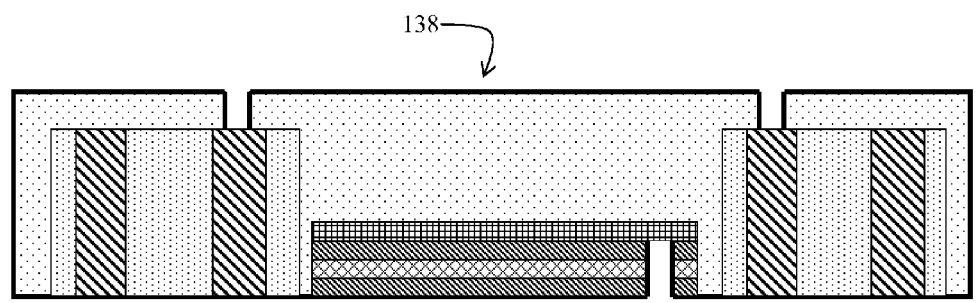
FIG. 29 is a schematic sectional illustration of the structure of FIG. 28 with metallic seed layers covering both upper and lower surfaces of the array, and coating the walls of the drill holes.

Seed layers 138 are applied to both sides, coating the surfaces of the drill holes 136, 138 giving the structure shown in FIG. 29—step 23(vii).

Figure 30:
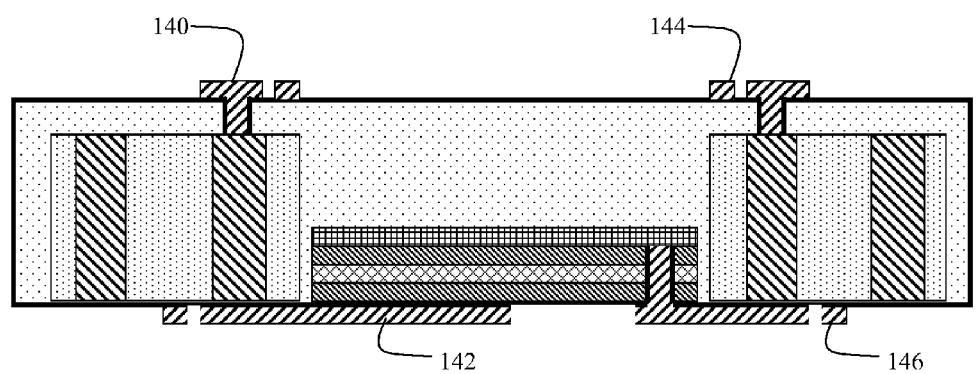
FIG. 30 is a schematic sectional illustration of the structure of FIG. 29 with the drill holes filled and contact pads and ring seals fabricated on each side.

Connection pads 140, 142 and sealing rings 144, 146 are now fabricated—step 23(viii). One fabrication route is by applying and patterning layers of photoresist on the two surfaces, and electroplating copper into the patterns on each side filling the holes 136, 138 giving the structure shown in FIG. 30.

Figure 31:
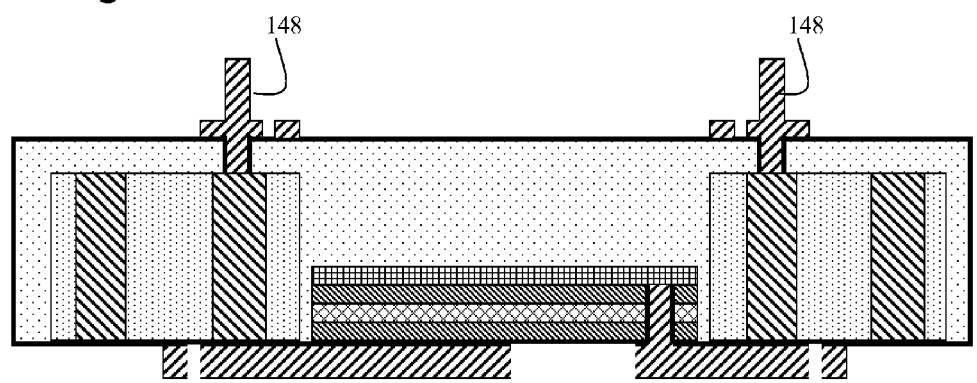
FIG. 31 is a schematic sectional illustration of the structure of FIG. 30 with via posts grown from the pads on opposite side of the structure to the membrane to well beyond the sealing ring for surface mounting, such as for coupling to a land grid array LGA.

Referring to FIG. 31, via posts 148 are grown from the lower pads (140—shown here at the top of the figure) to well beyond the lower sealing ring 144 for surface mounting, such as for coupling to a land grid array LGA—step 23(ix).

Figure 32:
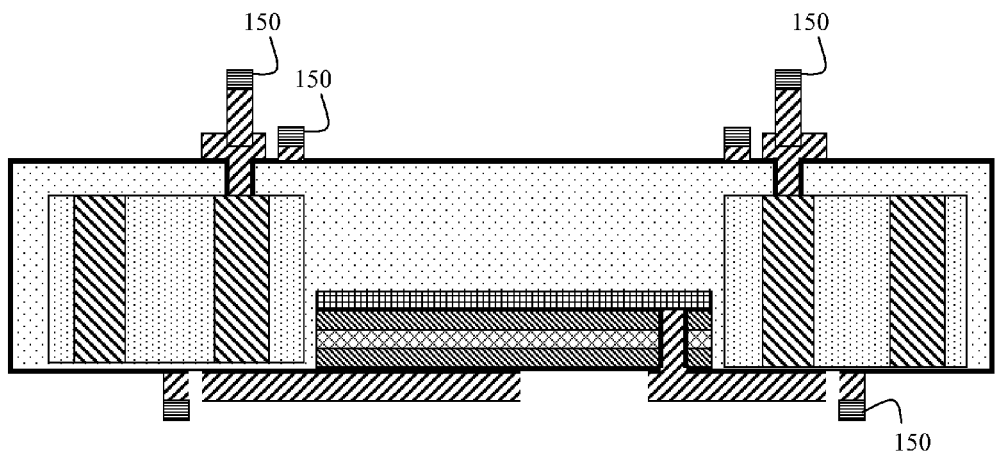
FIG. 32 is a schematic sectional illustration of the structure of FIG. 31 with the contact pads and the ring seals coated with nickel, gold or nickel gold.

The sealing rings 144, 146 and via posts 148 are now electroplated with Nickel Ni and Gold Au or Ni/Au connections 50—step 23(x), giving the structure shown in FIG. 32. The photoresist is stripped away.

Figure 33:
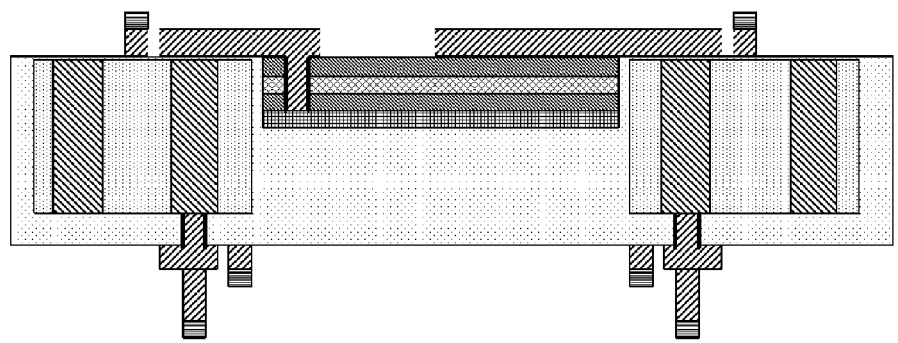
FIG. 33 is a schematic sectional illustration of the structure of FIG. 32 with the seed layer etched away.

The seed layers 138 are etched away—step (23xi) giving the structure shown in FIG. 33, which is also rotated through 180°.

Figure 34:
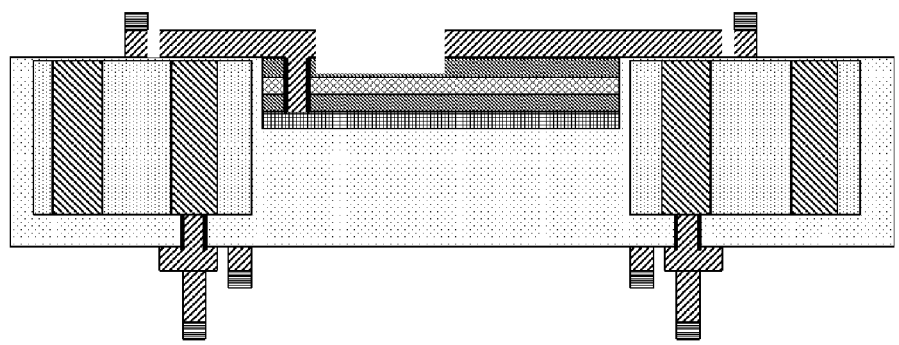
FIG. 34 is a schematic sectional illustration of the structure of FIG. 33 rotated through 180°, with the exposed (now) upper electrode etched away.

The upper electrode 18ii is partially etched away using an appropriate wet or dry etch, giving the structure shown in FIG. 34—step 23(xii).

Figure 35:
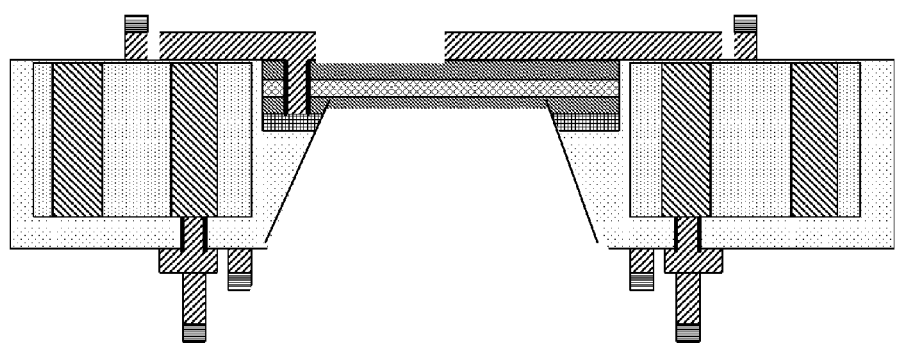
FIG. 35 is a schematic sectional illustration of structure of FIG. 34 with the attaching polymer substantially removed, and remnants of the interface layer removed from where exposed.

The polymer 30 under the piezoelectric film 16 may be etched away using a hard mask hard mask 29 (shown in FIG. 9), such as a stainless steel mask to protect the surrounding polymer and the terminations—step 23(xiii). A schematic representation of the resultant structure is shown in FIG. 35.

Figure 36:
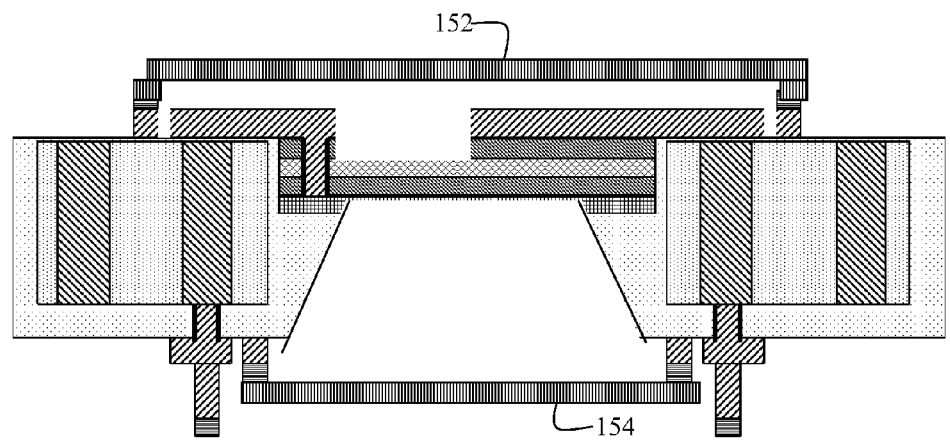
FIG. 36 is a schematic sectional illustration of structure of FIG. 35 with top and bottom lids attached to the lop and bottom ring seals.

As described hereinabove with reference to the first embodiment, lids 152, 154 with corresponding gold-tin contact rings may be applied—step 23(xiv) and bonded to the sealing rings of the structure by heating to the cause reflow of the Au/Sn eutectic. The resultant structure us shown in FIG. 36.

Solder seal lids, sometimes marketed as Combo Lids™ are standard components used for high reliability packaging in the semiconductor industry. They provide corrosion and moisture resistance and reliable packaging. They also conform to the military specification MIL-M-38510.

In alternative packages, ceramic lids may be used with a glass sealant, or, where hermetic sealing of the component is not required, such as where the whole device is subsequently hermetically sealed, an epoxy of other sealant may be used. Where appropriate, such as where hermetic sealing is not required, plastic lids such as liquid crystal polymer lids may be used with sealing rings of a low temp LCP on the package.

Figure 37:
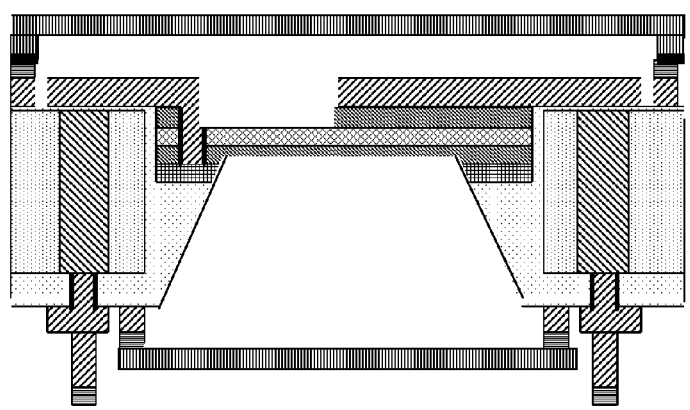
FIG. 37 is a schematic sectional illustration of structure of FIG. 36 after sectioning through the grid of frameworks to singulate the packaged acoustic resonator from the grid.

As noted previously, fabrication typically occurs in arrays. The grid of frames may now be singulated into the individual components—step 23(xv). It will be appreciated however, that the singulation could alternatively occur prior to the plasma thinning, enabling tuning individual components separately. The resultant structure is shown in FIG. 37. It will be appreciated that singulation may occur at a previous instance.

It will be appreciated that the process route and structures shown lend themselves to much variation. A double lidded frame may include other components in addition to the piezoelectric membrane 16, and may include two or more such membranes tuned to different frequencies, such as by having different thicknesses for example.

Persons skilled in the art will therefore appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed:

1. An acoustic resonator comprising a substantially horizontal membrane comprising a piezoelectric material with upper and lower metal electrodes on its upper and lower faces, said membrane being attached around its perimeter to the inner side walls of a rectangular interconnect frame by an attaching polymer, the side walls of the package frame being substantially perpendicular to the membrane and comprising conducting vias within a dielectric matrix, the conducting vias running substantially vertically within the side walls, the metal electrodes being conductively coupled to the metal vias by a feature layer over the upper surface of the membrane and top and bottom lids coupled to top and bottom ends of the interconnect frame to seal the acoustic resonator from its surroundings.

2. The acoustic resonator of claim 1, wherein the piezoelectric material comprises barium strontium titanate (BST).

3. The acoustic resonator of claim 2, wherein the membrane is supported from below by a frame of the attaching polymer with an air gap under the lower electrode.

4. The acoustic resonator of claim 3, further comprising an interface layer between the attaching polymer and the lower electrode.

5. The acoustic resonator of claim 4 wherein the interface layer is selected from the group consisting of AlN, TiN, GaN and InN.

6. The acoustic resonator of claim 4 wherein the interface layer has a thickness of 0.5-5 microns.

7. The acoustic resonator of claim 3, wherein the BST membrane is further attached from above by a frame of the attaching polymer.

8. The acoustic resonator of claim 2, wherein the lower electrode is accessed via a copper lead passing through the BST.

9. The acoustic resonator of claim 2, wherein the BST layer comprises a barium to strontium ratio between about 25/75 and about 75/25.

10. The acoustic resonator of claim 2, wherein the BST layer comprises a barium to strontium ratio of about 30/70.

11. The acoustic resonator of claim 2, wherein the BST layer is between 1000 5000 Angstroms thick.

12. The acoustic resonator of claim 1, wherein the lower electrode comprises tantalum or platinum.

13. The acoustic resonator of claim 1, wherein the lower electrode has a thickness between 1000 and 2500 angstrom.

14. The acoustic resonator of claim 2, wherein the BST has either a monocrystalline or polycrystalline structure.

15. The acoustic resonator of claim 2, wherein the upper electrode comprises a layer of aluminum, platinum or tantalum in contact with the BST dielectric.

16. The acoustic resonator of claim 15, wherein the upper electrode further comprises electrodeposited copper.

17. The acoustic resonator of claim 1, wherein the attaching polymer is a liquid crystal polymer.

18. The acoustic resonator of claim 1, wherein the interconnect frame comprises a ceramic matrix and metal vias.

19. The acoustic resonator of claim 18, wherein the interconnect frame is fabricated by co-firing with the vias to provide a monolithic ceramic support structure with in-built conductive vias.

20. The acoustic resonator of claim 18, wherein the ceramic is cofired with metallic vias using High or Low Temp Cofired Ceramic (HTCC or LTCC) material sets.

21. The acoustic resonator of claim 18, wherein the metal vias comprise a metal selected from the group consisting of Au, Cu and W.

22. The acoustic resonator of claim 1, wherein the frame comprises a polymer matrix and metal vias.

23. The acoustic resonator of claim 22, wherein the metal vias are copper vias.

24. The acoustic resonator of claim 22 wherein the frame further comprises ceramic filler and/or glass fibers.

25. The acoustic resonator of claim 1 wherein the depth of the frame is in the range of 150 microns to 300 microns.

26. The acoustic resonator of claim 1 wherein the top and bottom lids are fabricated from a material selected from the group consisting of: metal, ceramic, silicon, liquid crystal polymer and Glass.

27. The acoustic resonator of claim 1 wherein the top lid is attached to an upper metal ring fabricated on an upper surface of the interconnect frame and the bottom lid is attached to a lower metal ring on the lower surface of the interconnect frame.

28. The acoustic resonator of claim 27 wherein the upper metal ring is fabricated on the external edges of the interconnect frame and the lid covers the entire top surface of the frame, the attaching polymer and the upper surface of the membrane.

29. The acoustic resonator of claim 27 wherein the lower metal ring is fabricated on an inner edge of the lower surface of the interconnect frame to allow the lid to cover the surface of the attaching polymer, the exposed sacrificial carrier and the lower electrode of the membrane, leaving part of the lower surface of the interconnect frame uncovered.

30. The acoustic resonator of claim 27 wherein the upper and lower metal rings comprise a surface coating of Ni and Au and the lid comprises a corresponding sealing ring of Eutectic Au/Sn.

31. The acoustic resonator of claim 1 further comprises metal pads extending from vias of the interconnect frame around the bottom lid to below the bottom lid for allowing Solder Surface Mount attachment of the acoustic resonator to a PCB.

32. The acoustic resonator of claim 1 wherein the attaching polymer film extends over the upper surface of the piezoelectric material and upper electrode.

33. The acoustic resonator of claim 32 wherein the attaching polymer film covering the upper electrode has a thickness of up to 5 microns.

34. Use of the acoustic resonator of claim 1 as a switchable tunable filter.

35. Use of the acoustic resonator of claim 1 as a duplexer for transmitting and receiving a radio frequency over an antenna.

36. An RF communications device comprising an acoustic resonator of claim 1.

* * * * *